US012700859B2

(12) United States Patent
Tomioka

(10) Patent No.: US 12,700,859 B2
(45) Date of Patent: Aug. 4, 2026

(54) CURRENT LIMITER CIRCUIT AND CURRENT LIMITER DEVICE

(71) Applicant: ABLIC Inc., Nagano (JP)

(72) Inventor: Tsutomu Tomioka, Nagano (JP)

(73) Assignee: ABLIC Inc., Nagano (JP)

( * ) Notice: Subject to any disclaimer, the term of this patent is extended or adjusted under 35 U.S.C. 154(b) by 178 days.

(21) Appl. No.: 18/674,929

(22) Filed: May 27, 2024

(65) Prior Publication Data

US 2024/0405762 A1 Dec. 5, 2024

(30) Foreign Application Priority Data

May 31, 2023 (JP) ................................. 2023-089610
Mar. 19, 2024 (JP) ................................. 2024-043017

(51) Int. Cl.
*H03K 17/082* (2006.01)
*H03K 17/10* (2006.01)
*H03K 17/30* (2006.01)

(52) U.S. Cl.
CPC ....... *H03K 17/0822* (2013.01); *H03K 17/102* (2013.01); *H03K 17/302* (2013.01)

(58) Field of Classification Search
CPC .......... H02H 3/025; H02H 9/002; H02H 9/02; H02H 9/025; H03K 17/0822; H03K 17/102; H03K 17/302; H03K 2217/0054
USPC ....................................................... 361/93.9
See application file for complete search history.

(56) References Cited

U.S. PATENT DOCUMENTS

| | | | | |
|---|---|---|---|---|
| 5,670,865 | A | * | 9/1997 | Farwell ................... H02M 1/15 |
| | | | | 323/284 |
| 6,781,502 | B1 | * | 8/2004 | Robb ...................... H02H 9/004 |
| | | | | 337/167 |
| 2012/0056655 | A1 | * | 3/2012 | Brauer ..................... H03K 5/01 |
| | | | | 327/170 |

FOREIGN PATENT DOCUMENTS

| | | | | | |
|---|---|---|---|---|---|
| CN | 107565528 | B | * | 3/2019 | ............... H03K 5/08 |
| EP | 0490010 | A1 | * | 6/1992 | ............. H02H 9/004 |
| JP | 2005033869 | | | 2/2005 | |

OTHER PUBLICATIONS

Machine translation of Cao Chinese Patent Document CN 107565528 B Mar. 2019 (Year: 2019).*

* cited by examiner

*Primary Examiner* — Kevin J Comber
(74) *Attorney, Agent, or Firm* — JCIPRNET

(57) ABSTRACT

A current limiter circuit limits a current in a path connecting an input terminal and an output terminal through a switch including a control port, the switch controlling the current to a predetermined value or less. The current limiter circuit includes a gate controller and a negative feedback circuit. The gate controller includes an input port which is connected to a connection point between a first path through which a first signal is transmitted and a second path through which a second signal is transmitted, and receiving the first signal and an output port supplying a control signal to the control port of the switch. The negative feedback circuit includes an input port coupled to a node via a capacitor if the capacitor is connected between thereof and the node provided between the switch and the output terminal and an output port connected to the input port.

17 Claims, 18 Drawing Sheets

N4

310

311

N5

N4

310

VDD 9

313
Isscb

312

Issc

3121

3122

N5    N5

CURRENT LIMITER CIRCUIT AND CURRENT LIMITER DEVICE

CROSS-REFERENCE TO RELATED APPLICATION

This application claims the priority benefits of Japanese application serial no. 2023-089610, filed on May 31, 2023, and Japanese application serial no. 2024-043017, filed on Mar. 19, 2024. The entirety of each of the above-mentioned patent applications is hereby incorporated by reference herein and made a part of this specification.

BACKGROUND

Technical Field

The present invention relates to a current limiter circuit and a current limiter device.

Description of Related Art

In the case of supplying a current to a load, an excessive inrush current may occur. For example, in a so-called high-side switch provided in a current path (hereinafter simply referred to as a "path") connecting a current supply side and a load side, if a capacitive load or an inductive load is connected to an output port, an inrush current flows during a voltage rise process from a low output voltage state, such as during startup or in the case of the output port recovering from a ground fault. If the inrush current is excessive, since a device in the path may be damaged or destroyed, a current limiter circuit that suppresses the inrush of current is applied (for example, see Japanese Patent Application Laid-Open No. 2005-33869).

Like the inrush current suppression circuit described in Japanese Patent Application Laid-open No. 2005-33869, in a conventional current limiter circuit in which a low-pass filter formed by a resistor and a capacitor is connected to the gate of the FET, which is the control port of a high-side switch, the gate voltage can be controlled gradually. Since the gate voltage can be gradually lowered, the high-side switch can be turned on gradually even if an inrush current occurs.

However, in the conventional current limiter circuit as described above, the gate voltage changes slowly not only in response to a desire to turn the switch on but also in response to a desire to turn the switch off. Thus, even in a situation where a quick switch-off is required, a quick switch-off operation is hindered. In other words, there is a trade-off between suppression of an inrush current and switch-off speed.

SUMMARY

The present invention provides a current limiter circuit and a current limiter device that are capable of achieving both current suppression and switch-off speed.

A current limiter circuit according to at least one aspect of the present invention is a circuit which limits a current in a path connecting an input terminal and an output terminal through a switch including a control port, the switch controlling the current to a predetermined value or less. The current limiter circuit includes a controller and a negative feedback circuit. The controller includes a first input port which is connected to a connection point between a first path through which a first signal is transmitted and a second path through which a second signal is transmitted, and an output port which supplies a control signal combining the first signal and the second signal to a control port of the switch. The negative feedback circuit includes an input port which is coupled to a first node via a capacitor if the capacitor is connected between thereof and the first node and the output port connected to the first input port of the controller.

A current limiter device according to at least one aspect of the present invention includes the input terminal, the output terminal, the switch, the capacitor, and the above-described current limiter circuit.

According to the present invention, both current suppression and switch-off speed can be achieved.

DESCRIPTION OF THE EMBODIMENTS

A current limiter circuit and a current limiter device according to embodiments of the present invention will be described below with reference to the drawings. Note that for convenience of description, illustration of some components may be omitted or the scale may be changed.

First Embodiment

Figure 1:
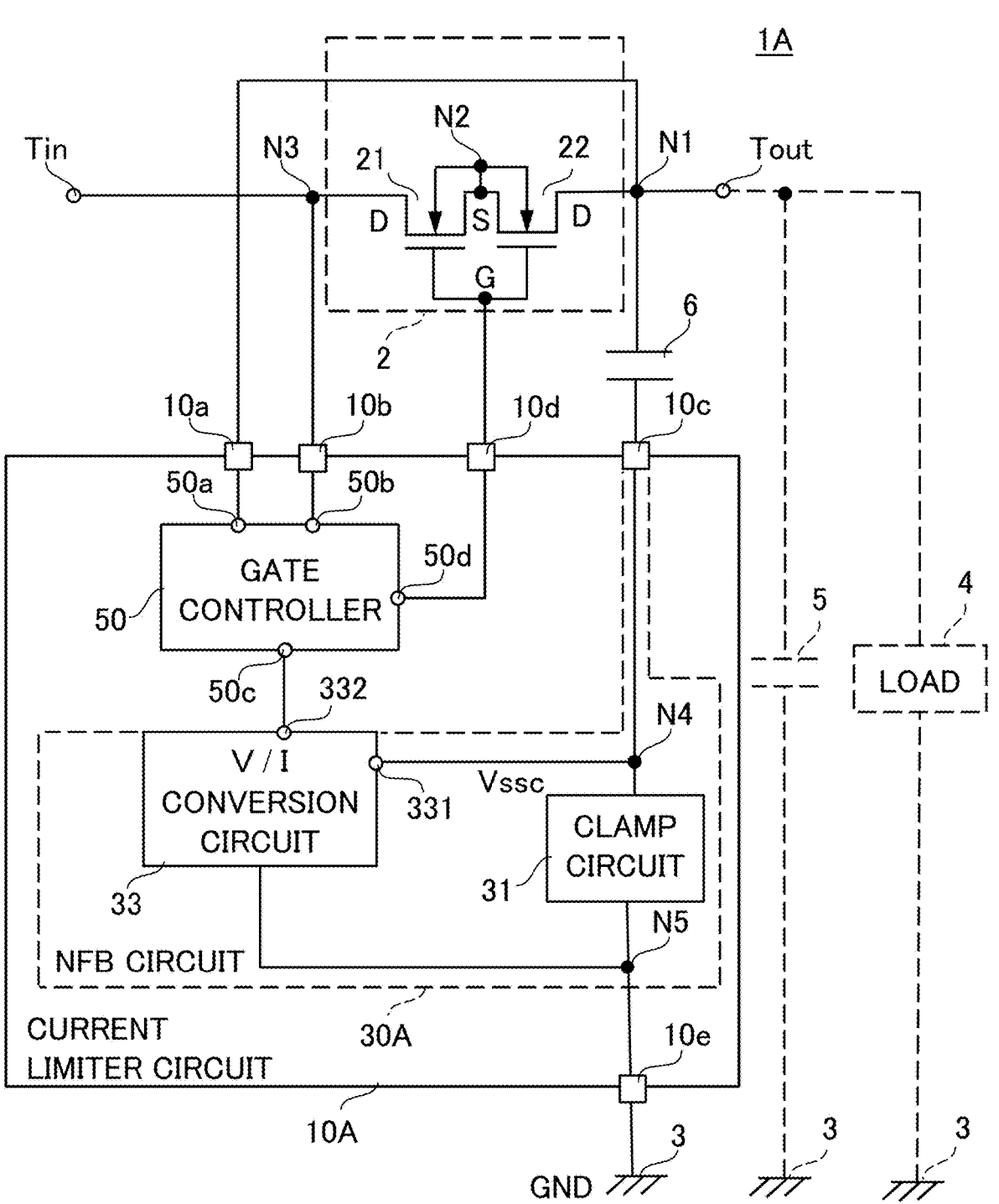
FIG. 1 is a block diagram schematically illustrating an application example of a current limiter circuit and a current limiter device according to a first embodiment of the present invention.

FIG. 1 is a block diagram schematically illustrating an application example of a current limiter circuit 10A and a current limiter device 1A, which are examples of the current limiter circuit and the current limiter device according to a first embodiment of the present invention. G, D, and S in the figure represent the gates, drains, and sources of N-type MOSFETs (hereinafter referred to as "NMOSFETs") 21 and 22, respectively.

The current limiter device 1A includes an input terminal Tin, an output terminal Tout, a switch 2, a capacitor 6, and the current limiter circuit 10A, and is a device in which the switch 2 limits a current in a path connecting the input terminal Tin and the output terminal Tout. A load 4 and an output capacitor 5 are connected between the output terminal Tout and a GND terminal 3 that supplies a ground voltage GND.

The switch 2 is configured to include at least a current limiter transistor which is a current limiter element that limits the current in the direction from the input terminal Tin side to the output terminal Tout side. The switch 2 includes the NMOSFET 21 which is an example of a current limiter transistor, and the NMOSFET 22 which is an example of a backflow prevention transistor, and the source of the NMOSFET 21 and the source of the NMOSFET 22 are connected together.

The drain of the NMOSFET 21 is connected to the input terminal Tin. The source of the NMOSFET 21 is connected to the source of the NMOSFET 22 and a bulk. The gate of the NMOSFET 21 is connected to the gate of the NMOSFET 22. The drain of the NMOSFET 22 is connected to the output terminal Tout. The source of the NMOSFET 22 is connected to the bulk. Here, the connection point between the source of the NMOSFET 21, the source of the NMOS-FET 22, and the bulk is called a node N2.

The current limiter circuit 10A includes input ports 10a, 10b, 10c, and 10e, an output port 10d, a gate controller 50 as a controller, and a negative feedback circuit 30A including a clamp circuit 31, a voltage-current conversion circuit (hereinafter referred to as a V/I conversion circuit) 33, and an output port. The input port 10a is connected to a node N1 provided between the switch 2 and the output terminal Tout. The input port 10b is connected to a node N3 provided between the switch 2 and the input terminal Tin. One end of the capacitor 6 is connected to the input port 10c. The input port 10e is connected to the GND terminal 3.

The gate controller 50 as a controller includes three input ports 50a, 50b, 50c and an output port 50d. The input port 50a is connected to the input port 10a. The input port 50b is connected to the input port 10b. The output port 50d is connected to the output port 10d.

In the negative feedback circuit 30A, the input port 10c of the current limiter circuit 10A corresponds to the input port of the negative feedback circuit 30A. Further, an output port 332 of the V/I conversion circuit 33 corresponds to the output port of the negative feedback circuit 30A, and is connected to the output port 50d of the gate controller 50. If the capacitor 6 is connected between the negative feedback circuit 30A and the node N1, the input port 10c (corresponding to the input port of the negative feedback circuit 30A) is coupled to the node N1 via the capacitor 6. As a result, in the current limiter circuit 10A, a negative feedback loop is formed from the node N1 to the gates of the NMOSFETs 21 and 22, which serve as control ports of the switch 2, via the capacitor 6, the negative feedback circuit 30A, and the gate controller 50.

The clamp circuit 31 is connected between a node N5 and a node N4, and is a circuit that clamps a voltage Vssc of the node N4 to the ground voltage GND. The node N5 is the same node as the input port 10e connected to the GND terminal 3, and the node N4 is the same node as the input port of the negative feedback circuit 30A, which corresponds to the input port 10c of the current limiter circuit 10A.

The V/I conversion circuit 33 includes the input port of the negative feedback circuit 30A, that is, an input port 331 which receives the voltage Vssc of the node N4, and the output port 332 through which a converted current I1 flows. The input port 331 is connected to the node N4, which is the same node as the input port of the negative feedback circuit 30A. The output port 332 is connected to the input port 50c of the gate controller 50.

If the voltage received from the input port 331, that is, the voltage Vssc of the node N4, is higher than a threshold voltage Vth, the V/I conversion circuit 33 is a circuit that converts the voltage Vssc of the node N4 into the current I1 based on a differential voltage Vod (=Vssc−Vth) between the voltage Vssc and the threshold voltage Vth. If a mutual conductance Gm of the V/I conversion circuit 33 and the differential voltage Vod are used, the current I1 obtained by the conversion by the V/I conversion circuit 33 can be expressed as the product of the mutual conductance Gm and the differential voltage Vod (=Gm×Vod). Note that the voltage Vssc of the node N4 in a state (hereinafter referred to as "steady state") where a voltage (hereinafter referred to as "output voltage") Vout of the output terminal Tout is stable without voltage increase is set to a voltage value that does not exceed the threshold voltage Vth.

The current limiter circuit 10A configured in such way is designed so that the voltage of the control signal supplied from the gate controller 50 decreases in response to the V/I conversion circuit 33 passing the current I1, and if the output voltage Vout rises sharply, the gate voltage of the NMOS-FET 21 can be reduced, and an output current Iout of the NMOSFET 21 can be reduced.

Figure 2:
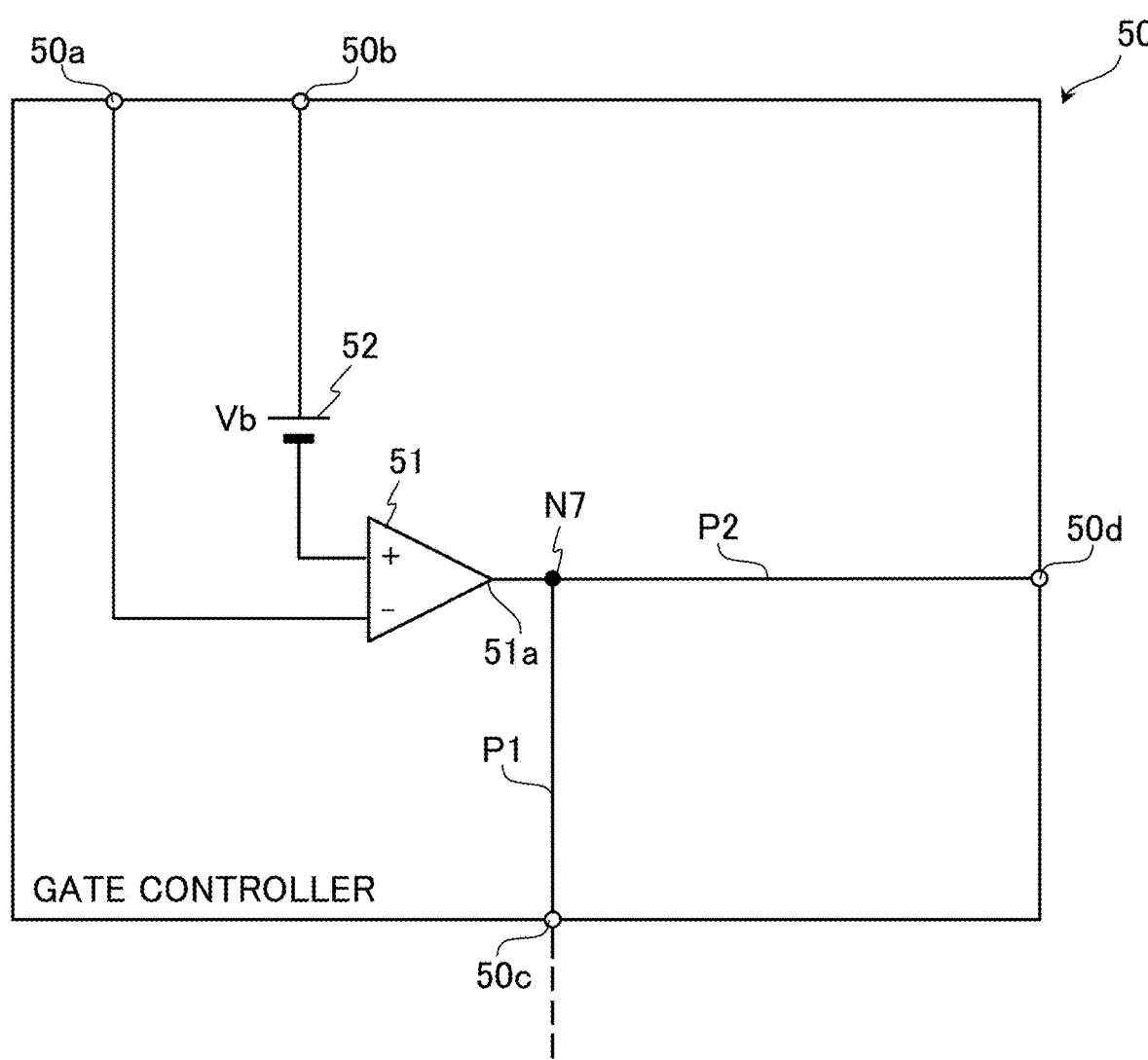
FIG. 2 is a schematic diagram illustrating a first configuration example of a gate controller included in the current limiter circuit according to the first embodiment.

Next, each of circuits in the current limiter circuit 10A will be described in more detail. FIG. 2 is a schematic diagram illustrating the gate controller 50 (first configuration example).

The gate controller 50 as a controller includes three input ports 50a, 50b, and 50c, an output port 50d, and a voltage detection circuit 51.

The voltage detection circuit 51 is a circuit that includes a non-inverting input port (+) connected to the input port 50b via a voltage source 52 that generates a voltage drop Vb, an inverting input port (−) connected to the input port 50a, and an output port 51a, and outputs a signal based on a voltage difference between the voltages respectively received at the non-inverting input port (+) and the inverting input port (−).

A path P1 and a path P2 are formed in the gate controller 50. The path P1 connects the input port 50c and a node N7 and transmits a negative feedback signal from the negative feedback circuit 30A. The path P2 connects the output port 51a and the output port 50d via the node N7 and transmits a voltage detection signal which is an output signal from the voltage detection circuit 51. The path P1 as a first path and the path P2 as a second path are connected at the node N7. Since the gate controller 50 includes the node N7, the negative feedback signal as the first signal and the voltage detection signal as the second signal are combined at the node N7, and the combined signal is supplied to the switch 2 from the output port 50d as a control signal.

Figure 3:
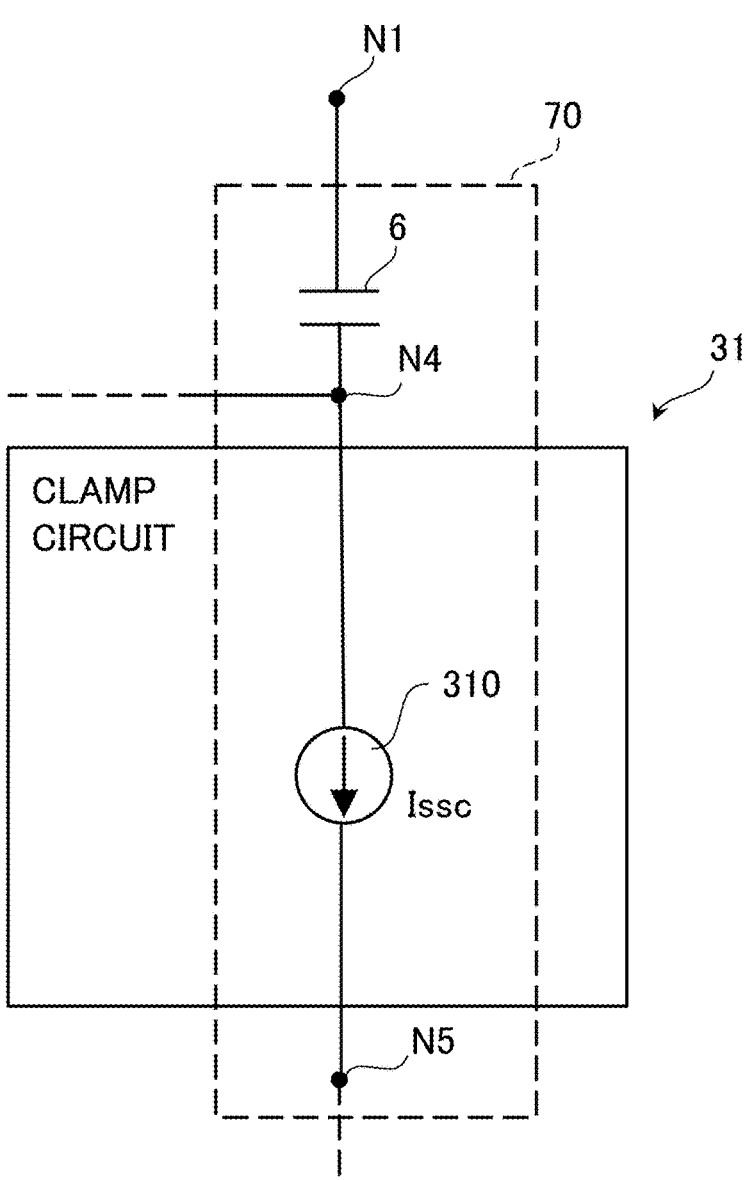
FIG. 3 is a schematic diagram illustrating a first configuration example of a clamp circuit included in the current limiter circuit according to the first embodiment.

FIG. 3 is a schematic diagram illustrating the clamp circuit 31 (first configuration example).

The clamp circuit 31 includes, for example, a constant current source 310 that supplies a constant current (current value Issc) from the node N4 to the node N5. The constant current source 310, together with an externally attached capacitor 6, constitutes a DC cut filter 70 that cuts off DC components.

Figure 4A:
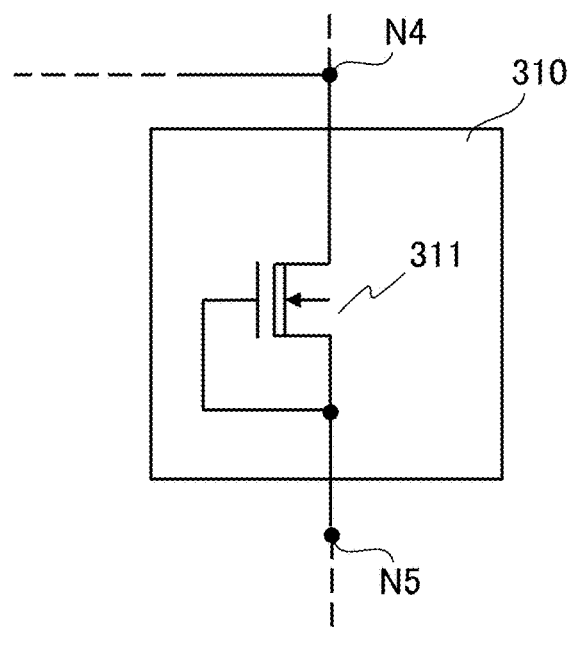
FIG. 4A is a schematic diagram illustrating a first configuration example of a constant current source included in a clamp circuit included in the current limiter circuit according to the first embodiment.
Figure 4B:
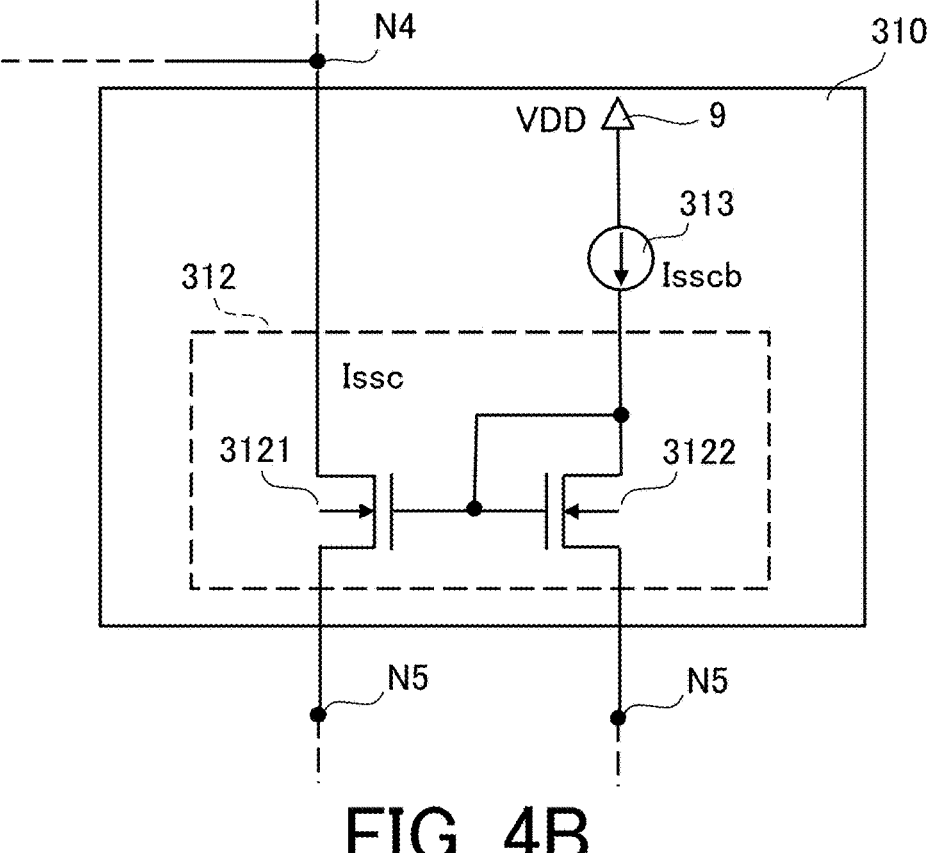
FIG. 4B is a schematic diagram illustrating a second configuration example.

FIG. 4A is a schematic diagram illustrating a first configuration example of the constant current source 310. FIG. 4B is a schematic diagram illustrating a second configuration example of the constant current source 310.

The constant current source 310 as a first constant current source includes, for example, a depletion type NMOSFET 311 as a depletion type FET of which a source and a gate are connected, and is configured to flow a constant current Issc is through a drain of the depletion type NMOSFET 311.

Further, the constant current source 310 can also be configured to include a current mirror circuit 312 configured by connecting an NMOSFET 3121 as a first FET and an NMOSFET 3122 as a second FET and a constant current source 313 as a second constant current source that flows a constant current Isscb to the drain of the NMOSFET 3122. The constant current source 310 including the current mirror circuit 312 and the constant current source 313 can generate and flow a constant current Issc to the drain of the NMOS-FET 3121, that is, the node N4, based on the constant current Isscb which is the drain current of the NMOSFET 3122. A VDD terminal 9 illustrated in FIG. 4B is a power supply port different from the GND terminal 3, and is a power supply port that supplies a power supply voltage VDD different from the ground voltage GND.

Figure 5:
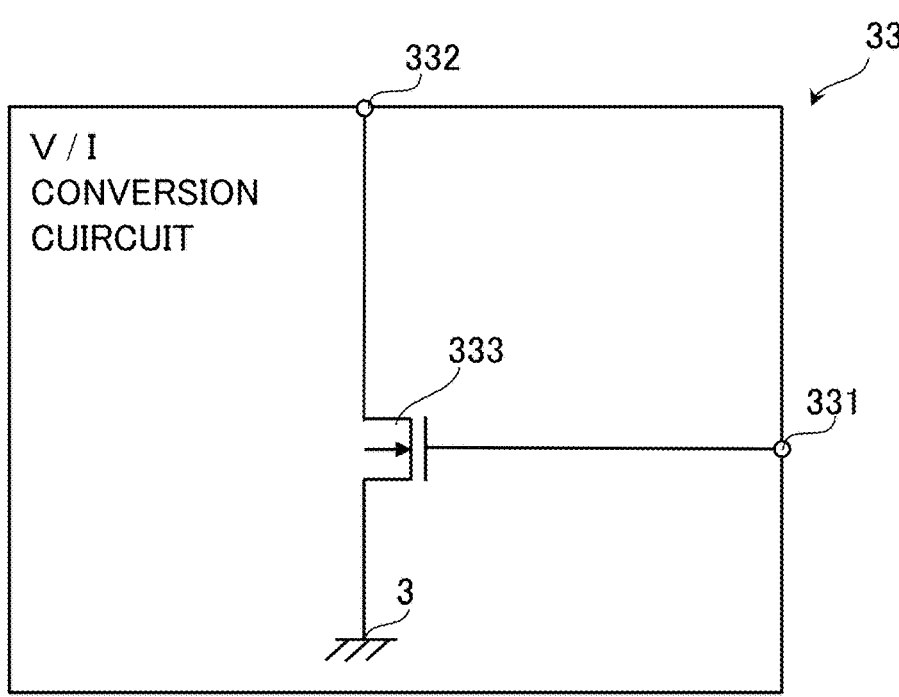
FIG. 5 is a schematic diagram illustrating a first configuration example of a voltage-current conversion circuit included in the current limiter circuit according to the first embodiment.

FIG. 5 is a schematic diagram illustrating the V/I conversion circuit 33 (first configuration example).

The V/I conversion circuit 33 is configured with an NMOSFET 333 including a drain connected to the output port 332, a gate connected to the input port 331, and a source connected to the GND terminal 3. In the V/I conversion circuit 33 including the NMOSFET 333, the threshold voltage Vth may be set to the threshold voltage of the NMOSFET 333.

Next, the operation and effects of the current limiter device 1A including the current limiter circuit 10A will be described.

The current limiter circuit 10A controls the current supplied to the load 4 by controlling the on-resistance (resistance value) of the NMOSFET 21 and the NMOSFET 22 connected between the input terminal Tin and the output terminal Tout. The gate controller 50 generates a control signal that combines the node N3 on the input terminal Tin side, a voltage detection signal based on the voltage of the node N1 on the output terminal Tout side, and a negative feedback signal from the negative feedback circuit 30A. The gate controller 50 controls the on-resistances (resistance values) of the NMOSFETs 21 and 22 by supplying the generated control signals to the gates of the NMOSFETs 21 and 22 serving as the control port of the switch 2.

In the steady state, the differential voltage Vod (=Vssc−Vth) between the voltage Vssc and the threshold voltage Vth becomes 0 [V], so the current I1 flowing through the path P1 becomes 0 [A], and the voltage detection signal transmitted from the path P2 becomes dominant. That is, in the steady state, the voltage detection signal transmitted from the path P2 becomes a de facto control signal, and the on-resistances (resistance values) of the NMOSFET 21 and the NMOSFET 22 are controlled.

Next, the operation of the current limiter circuit 10A during an unsteady state where the output voltage Vout is increasing will be described.

Figure 6:
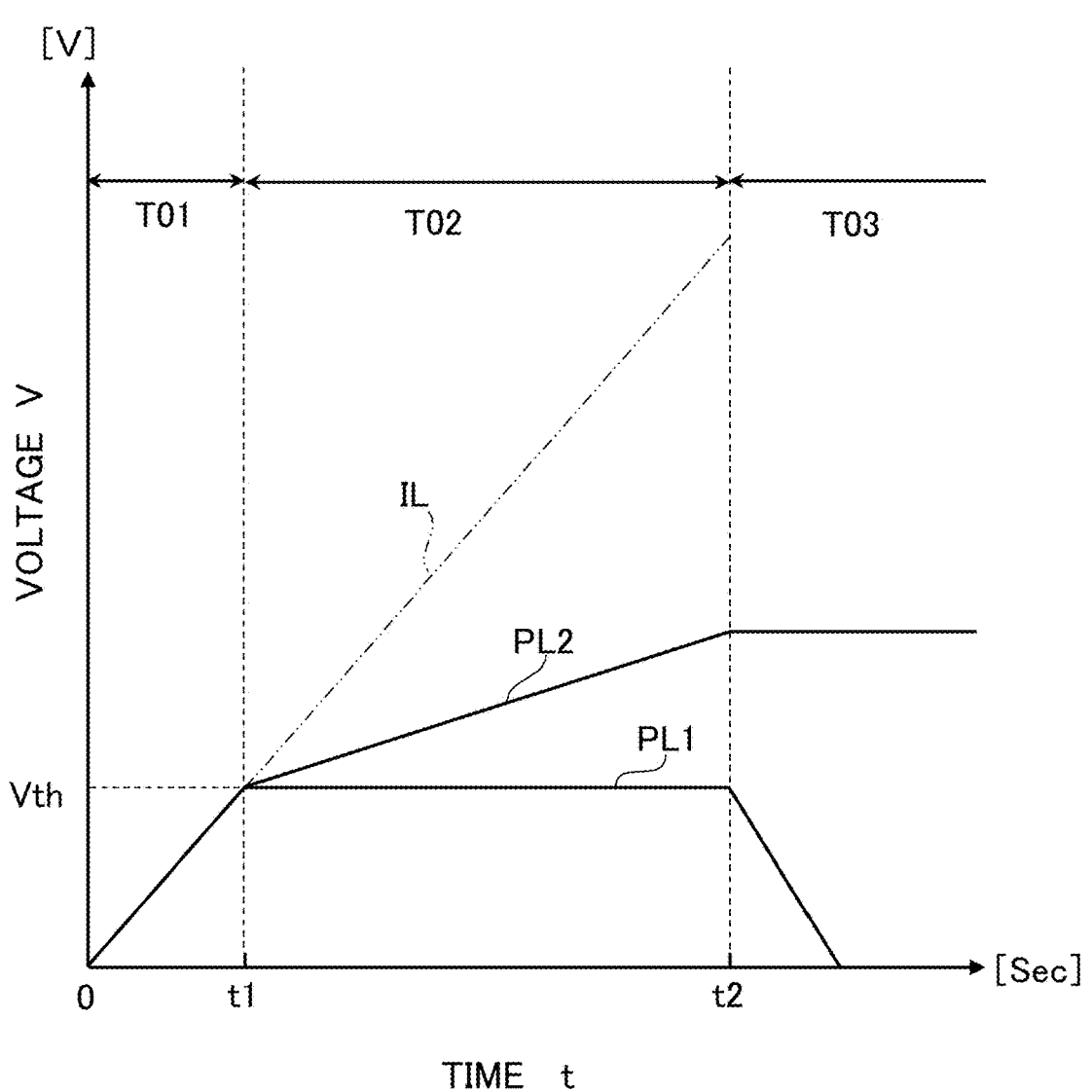
FIG. 6 is a graph illustrating the time transition of the output voltage in the current limiter circuit and the voltage of the input port of the negative feedback circuit in the first embodiment, with the horizontal axis representing time and the vertical axis representing voltage.

FIG. 6 is a graph illustrating the time transition of the output voltage Vout (line PL2) in the current limiter circuit 10A and the input port 10c of the negative feedback circuit 30A, that is, the voltage Vssc (line PL1) of the node N4, with the horizontal axis representing time t and the vertical axis representing voltage V.

For description, it is assumed that the output voltage Vout starts to rise at time t=0 [second], the voltage Vssc reaches the threshold voltage Vth at time t=t1, and the rise in the output voltage Vout ends at time t=t2. Moreover, the voltage Vssc of the node N4 in the steady state is Vssc=GND=0 [V]. Furthermore, line PL1 and line PL2 illustrated in FIG. 6 represent voltage Vssc and output voltage Vout, respectively.

If the output voltage Vout starts to rise (time t=0 seconds), a positive charge is accumulated at the upper port of the capacitor 6, and a negative charge is accumulated at the lower port. The movement of charge in the capacitor 6 can be regarded as a current Ic flowing through the capacitor 6. The current Ic can be expressed by the following formula (1) using the capacitance value Cssc of the capacitor 6 and the output voltage Vout.

$$Ic = Cssc \times d\text{Vout}/dt \qquad (1)$$

If the current Ic flowing through the capacitor 6 is greater than the current value Issc of the constant current supplied by the constant current source 310, the voltage Vssc (line PL1) rises. Furthermore, the output voltage Vout (line PL2)

rises without negative feedback during a period T01 until time t=t1 when the voltage Vssc (line PL1) reaches the threshold voltage Vth.

If the voltage Vssc exceeds the threshold voltage Vth, the V/I conversion circuit 33 generates the current I1 proportional to the differential voltage Vod (=Vssc-Vth). Once the current I1 is generated, control is applied to lower the gate voltage of the NMOSFET 21, that is, negative feedback is applied, and the V/I conversion circuit 33 controls the voltage of the input port 331 so as to create a virtual short (Vod≈0 [V]). Thus, the voltage Vssc is controlled to a voltage value approximately equal to the threshold voltage Vth (Vssc Vth).

If the voltage Vssc is controlled to a voltage value approximately equal to the threshold voltage Vth (Vssc≈Vth), since the current Ic flowing through the capacitor 6 is limited to the current value Issc, the slope of the output voltage Vout after reaching Vssc Vth becomes constant. The phenomenon is known as the slew rate SR of a negative feedback circuit via capacitor, and can be expressed by the following formula (2) in the current limiter circuit of 10A.

$$d\text{Vout}/dt = SR \approx Issc/Cssc \tag{2}$$

In this way, the voltage rise (=slope of the graph) of the output voltage Vout per unit time is limited to the slew rate SR of the DC cut filter 70 by the alternating current (AC) negative feedback via the DC cut filter 70. The state continues during a period T02 until time t=t2 when the rise in output voltage Vout ends.

Furthermore, if the rise of the output voltage Vout ends at time t=t2, in a period T03 after time t=t2, the voltage Vssc decreases from the threshold voltage Vth toward 0 [V], which is a voltage in the steady state. On the other hand, the output voltage Vout becomes substantially equal to the input voltage Vin, which is the voltage of the input terminal Tin, and thus becomes a constant value.

In this way, according to the current limiter circuit 10A, the voltage rise per unit time of the output voltage Vout, which is the slope of the line PL2 during the period T02 is suppressed to be smaller than an imaginary line IL obtained by extending the slope of the line PL2 in the period T01 to the period T02.

In the current limiter circuit 10A and the current limiter device 1A, the current flowing through an output capacitor 5 is determined by the SR of the output voltage Vout and a capacitance value Cout of the output capacitor 5. Here, to simplify the description, it is assumed that if the output capacitor 5 is in a light load state and all the output current Iout flows into the output capacitor 5, the output current Iout can be expressed by the following formula (3).

$$I\text{out} \approx Issc \cdot Cout/Cssc \tag{3}$$

Formula (3) means that the inrush current flowing through the output capacitor 5 can be controlled to a current value determined by three constants: the capacitance value Cssc of the capacitor 6, the current value Issc of the constant current source 310, and the capacitance value Cout of the output capacitor 5.

As described above, according to the current limiter circuit 10A and the current limiter device 1A including the current limiter circuit 10A, since a capacitor for slowing the change in gate voltage of NMOSFET 21 and NMOSFET 22 is not connected, the speed at which the switch 2 is turned off is not hindered. On the other hand, if the output voltage Vout rises suddenly, the DC cut filter 70 configured in combination with the externally attached capacitor 6 can limit the rise (slope) of the output voltage Vout per unit time to the slew rate SR of the DC cut filter 70. In this way, according to the current limiter circuit 10A and the current limiter device 1A including the current limiter circuit 10A, if the output voltage Vout increases, the increase can be limited without reducing the switch-off speed. In other words, there is no trade-off between current suppression and switch-off speed, and current suppression and switch-off speed can both be achieved.

Further, according to the current limiter circuit 10A and the current limiter device 1A including the current limiter circuit 10A, even in the case of including the NMOSFET 21 in which the switch 2 is a current limiter transistor and the NMOSFET 22 which is a backflow prevention transistor, supplying individual control signals to the gates of each of transistors is not needed, and the same control signal can be supplied for operation. Thus, in the current limiter circuit 10A and the current limiter device 1A including the current limiter circuit 10A, there is no need to separately provide a gate controller for operating the current limiter transistor and a gate controller for operating the backflow prevention transistor, and the gate controller 50 can be integrated into one gate controller.

Furthermore, according to the current limiter circuit 10A and the current limiter device 1A including the current limiter circuit 10A, as described above, since the output current Iout which is inrush current flowing through the output capacitor 5 is determined by a constant including the ratio (Cout/Cssc) of the respective capacitance values of the output capacitor 5 and the capacitor 6 which are external components of the current limiter circuit 10A (see formula (3)), a circuit and a device with a high degree of freedom in circuit design can be provided.

In addition, in the embodiment, an example has been described in which the V/I conversion circuit 33 includes the NMOSFET 333, but the V/I conversion circuit 33 is not limited to the above-mentioned example. For example, the V/I conversion circuit 33 (exemplified in FIG. 7) which is a modified example as described later may be employed.

Figure 7:
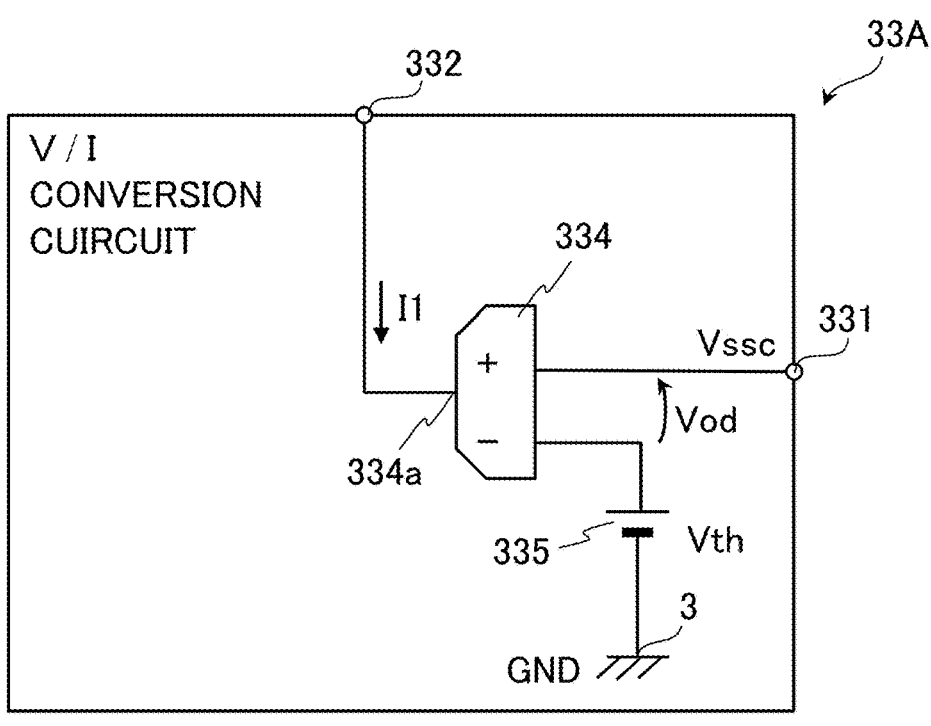
FIG. 7 is a schematic diagram illustrating a modified example (second configuration example) of the voltage-current conversion circuit included in the current limiter circuit according to the first embodiment.

FIG. 7 is a schematic diagram illustrating a V/I conversion circuit 33A which is a modified example of the V/I conversion circuit 33.

The V/I conversion circuit 33A is different in that the V/I conversion circuit 33A includes a so-called operational transconductance amplifier (OTA) 334 instead of the NMOSFET 333 of the V/I conversion circuit 33, but is not substantially different in other respects. The OTA 334 is an amplifier circuit that includes the mutual conductance Gm and allows the current I1 equal to the product of the differential voltage Vod and the mutual conductance Gm to flow through an output port 334a if the differential voltage Vod between the non-inverting input port (+) and the inverting input port (−) is positive (differential voltage Vod>0). The non-inverting input port (+) of the OTA 334 is connected to the input port 331. The inverting input port (−) is connected to the output port of a reference voltage source 335 that supplies the threshold voltage Vth as a reference voltage. The output port 334a is connected to the output port 332.

Second Embodiment

Figure 8:
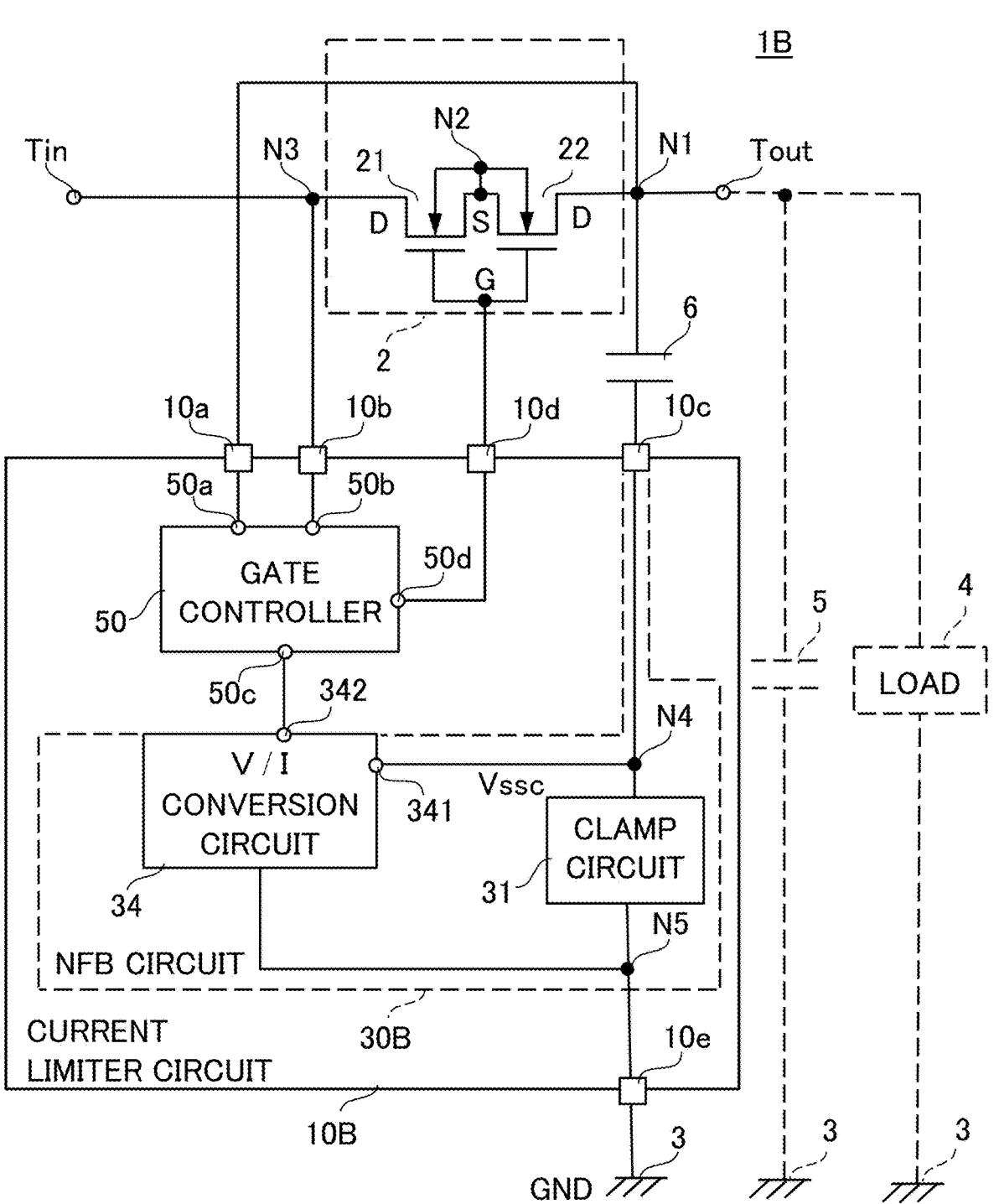
FIG. 8 is a block diagram schematically illustrating an application example of a current limiter circuit and a current limiter device according to a second embodiment of the present invention.

FIG. 8 is a block diagram schematically illustrating an application example of a current limiter circuit 10B and a current limiter device 1, which are examples of the current limiter circuit and the current limiter device according to a second embodiment of the present invention.

The current limiter device 1B is different from the current limiter device 1A in that the current limiter device 1B includes a current limiter circuit 10B instead of the current limiter circuit 10A. The current limiter circuit 10B differs from the current limiter circuit 10A in that the current limiter circuit 10B includes a negative feedback circuit 30B including a V/I conversion circuit 34 instead of the negative feedback circuit 30A including the V/I conversion circuit 33, but is substantially the same in other respects. Thus, in the description of the embodiment, the differences between the current limiter circuit 10A and the current limiter device 1A will be mainly described, and configurations that are not substantially different will be given the same reference numerals and descriptions will be omitted.

The current limiter device 1B includes the input terminal Tin, the output terminal Tout, the switch 2, the capacitor 6, and the current limiter circuit 10B. The current limiter circuit 10B includes the input ports 10a, 10b, 10c, and 10e, the output port 10d, the gate controller 50 as a controller, and the negative feedback circuit 30B including the clamp circuit 31, the V/I conversion circuit 34, and an output port. The input port 10a is connected to the node N1 serving as a first node provided between the switch 2 and the output terminal Tout. The input port 10b is connected to the node N3 serving as a third node provided between the switch 2 and the input terminal Tin. One end of the capacitor 6 is connected to the input port 10c. The input port 10e is connected to the GND terminal 3.

In the negative feedback circuit 30B, the input port 10c of the current limiter circuit 10B corresponds to the input port of the negative feedback circuit 30B. Further, the output port 342 of the V/I conversion circuit 34 corresponds to the output port of the negative feedback circuit 30B, and is connected to the output port 50c of the gate controller 50. If the capacitor 6 is connected between the negative feedback circuit 30B and the node N1, the input port 10c (corresponding to the input port of the negative feedback circuit 30B) is coupled to the node N1 via the capacitor 6. As a result, in the current limiter circuit 10B, a negative feedback loop is formed from the node N1 to the gates of the NMOSFETs 21 and 22, which serve as control ports of the switch 2, via the capacitor 6, the negative feedback circuit 30B, and the gate controller 50.

The V/I conversion circuit 34 includes the input port of the negative feedback circuit 30B, that is, the input port 341 that receives the voltage Vssc of the node N4, and the output port 342 through which the converted current I1 flows. The input port 341 is connected to the node N4, which is the same node as the input port of the negative feedback circuit 30B. The output port 342 is connected to the input port 50c of the gate controller 50.

If the voltage received from the input port 341, that is, the voltage Vssc of the node N4, is higher than the threshold voltage Vth, the V/I conversion circuit 34 is a circuit that converts the voltage Vssc of the node N4 into the current I1 and a current I2 based on the differential voltage Vod (=Vssc−Vth) between the voltage Vssc and the threshold voltage Vth into the current I1 and a current I2. If mutual conductances Gm1 and Gm2 of the V/I conversion circuit 34 and the differential voltage Vod are used, the current I1 and the current I2 obtained by conversion by the V/I conversion circuit 34 each can be expressed as the product of the mutual conductances Gm1 and Gm2 and the differential voltage Vod (I1=Gm1×Vod, I2=Gm2×Vod), respectively. Note that the voltage Vssc of the node N4 in a state (hereinafter referred to as "steady state") where a voltage (hereinafter referred to as "output voltage") Vout of the output terminal Tout is stable without voltage increase is set to a voltage value that does not exceed the threshold voltage Vth.

The current limiter circuit 10B configured in such way is designed so that the voltage of the control signal supplied from the gate controller 50 decreases in response to the V/I conversion circuit 34 passing the current I1, and if the output voltage Vout rises sharply, the gate voltage of the NMOSFET 21 can be reduced, and the output current Iout of the NMOSFET 21 can be reduced.

Figure 9:
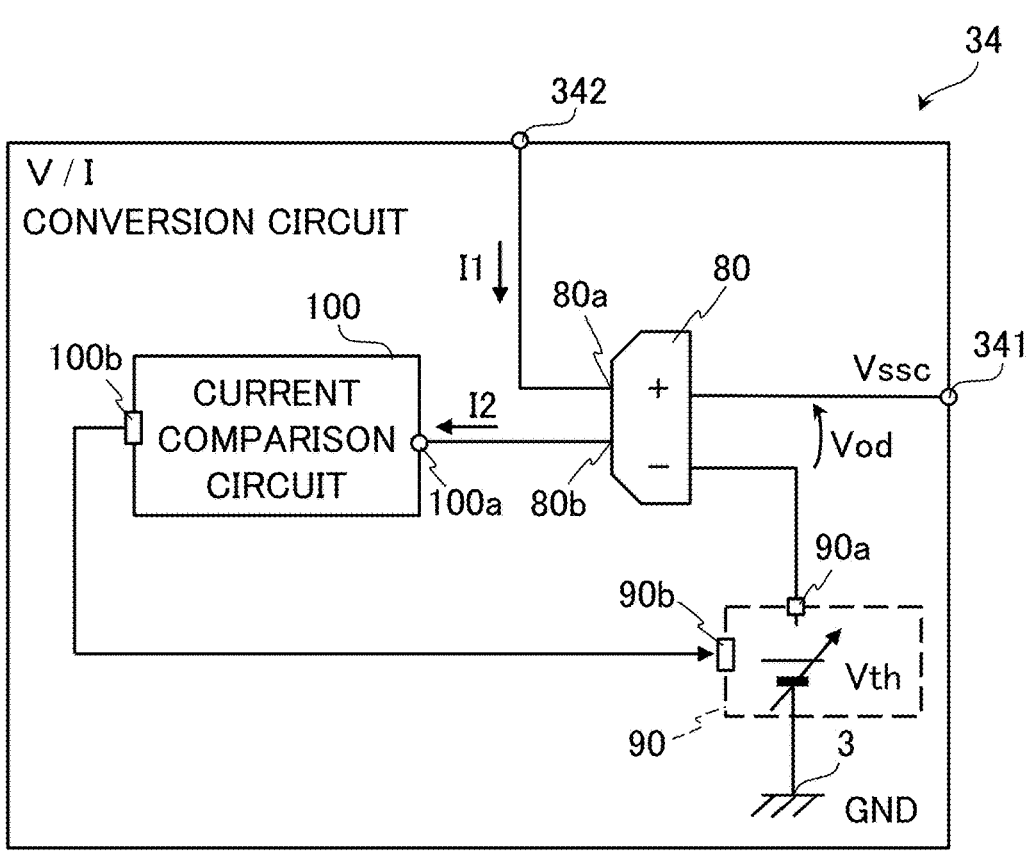
FIG. 9 is a schematic diagram illustrating a first configuration example of a voltage-current conversion circuit included in the current limiter circuit according to the second embodiment.

FIG. 9 is a schematic diagram illustrating the V/I conversion circuit 34 (basic configuration example).

The V/I conversion circuit 34 includes, in addition to the input port 341 and the output port 342, a so-called operational transconductance amplifier (OTA) 80, a voltage source 90, and a current comparison circuit 100 as a switching signal generation circuit. The voltage source 90 is able to switch between two different threshold voltages Vth based on a switching signal received from a control port 90b and output the same from an output port 90a.

The OTA 80 as an amplifier circuit is configured as a two-input and two-output circuit which includes two input ports including a non-inverting input port (+) and an inverting input port (−) and two output ports 80a and 80b. The OTA 80 is a circuit that has two different mutual conductances Gm1 and Gm2, and allows the current I2 equal to the product of the differential voltage Vod and the mutual conductance Gm2 to flow through the output port 80b while allowing the current I1 equal to the product of the differential voltage Vod and the mutual conductance Gm1 to flow through the output port 80a the differential voltage Vod between the non-inverting input port (+) and the inverting input port (−) becomes positive (differential voltage Vod>0). The non-inverting input port (+) of the OTA 80 is connected to the input port 341. The inverting input port (−) is connected to the output port 90a of the voltage source 90 that supplies the threshold voltage Vth. The output port 80a is connected to the output port 342.

The voltage source 90 is a variable voltage source that includes the output port 90a and a control port 90b, and is able to select one of two different threshold voltages (hereinafter, the lower voltage is referred to as the threshold voltage "VthL", and the higher voltage is referred to as the threshold voltage "VthH") based on the switching signal received from the control port 90b as the threshold voltage Vth and output the threshold voltage Vth.

The current comparison circuit 100 includes an input port 100a and an output port 100b, and is configured to be able to output a signal corresponding to whether the current I2 received from the input port 100a is larger or smaller than the reference current from the output port 100b as a switching signal of the threshold voltage Vth.

Figure 10:
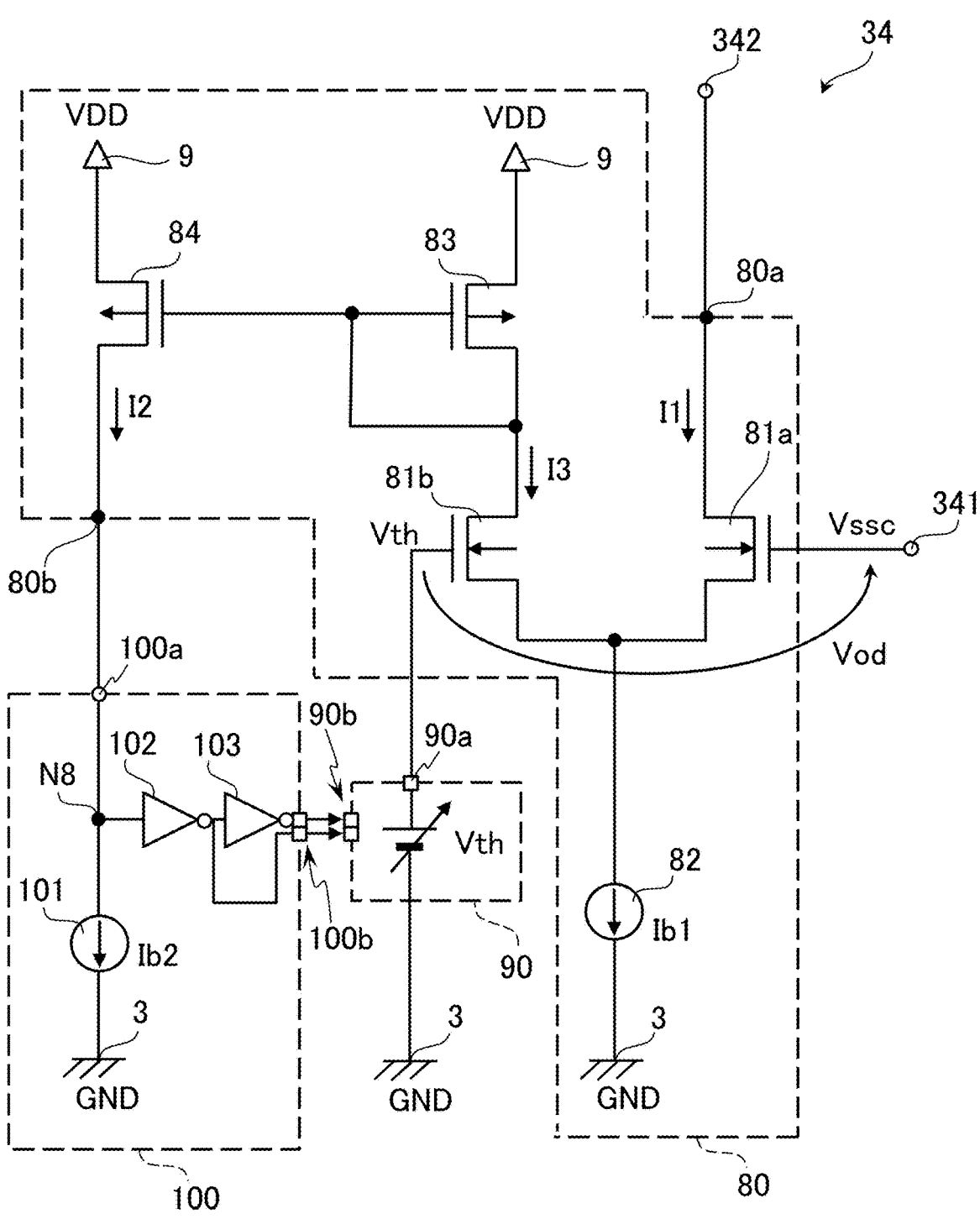
FIG. 10 is a schematic diagram illustrating a more detailed configuration example of the voltage-current conversion circuit included in the current limiter circuit according to the second embodiment.

FIG. 10 is a schematic diagram illustrating a more detailed configuration example of the V/I conversion circuit 34 by illustrating the OTA 80 and the current comparison circuit 100 in the V/I conversion circuits 34 in more detail.

The OTA 80 includes a pair of NMOS transistors 81a and 81b forming a differential pair, a constant current source 82 that supplies a constant current Ib1, and PMOS transistors 83 and 84 which form a current mirror circuit with a mirror ratio k (k is a positive number).

The NMOS transistor 81a includes a gate connected to the input port 341 and corresponding to the non-inverting input port (+) of the OTA 80, a drain connected to the output port 342 and corresponding to the output port 80a of the OTA 80, and a source. The NMOS transistor 81*b* includes a gate connected to the output port 90*a* and corresponding to the inverting input port (−) of the OTA 80, a drain, and a source connected to the source of the NMOS transistor 81*a*. The constant current source 82 includes a first port connected to the source of the NMOS transistor 81*a* and the source of the NMOS transistor 81*b* and a second port connected to the GND terminal 3.

The gate and drain of the PMOS transistor 83 are connected to the gate of the PMOS transistor 84. Each of the sources of the PMOS transistors 83 and 84 is connected to the VDD terminal 9. The drain of the PMOS transistor 83 is connected to the drain of the NMOS transistor 81*b*. The drain of the PMOS transistor 84 is connected to the current comparison circuit 100 (more specifically, the input port 100*a*) and corresponds to the output port 80*b* of the OTA 80.

The current comparison circuit 100 includes, in addition to the input port 100*a* and the output port 100*b*, a constant current source 101, an inverter 102, and an inverter 103. The constant current source 101 supplies a constant current Ib2 which is a reference current for comparison with the received current I2. The inverter 102 includes an input port connected to a node N8, which is a connection point between the input port 100*a* and the constant current source 101 and an output port connected to the output port 100*b* of the current comparison circuit 100. The inverter 103 includes an input port connected to the output port of the inverter 102 and an output port connected to the output port 100*b* of the current comparison circuit 100.

Here, the constant current Ib2 is set so that the magnitude relationship with the current I2 is reversed in response to the voltage Vssc rising to exceed the threshold voltage VthH or the voltage Vssc falling to fall below the threshold voltage VthL. That is, the current comparison circuit 100 is configured to transition the signal level of the switching signal of the threshold voltage Vth output from the output port 100*b* from a low level to a high level if the voltage Vssc exceeds the threshold voltage VthH, and to transition the signal level of the switching signal of the threshold voltage Vth output from the output port 100*b* from a high level to a low level if the voltage Vssc falls below the threshold voltage VthL.

Moreover, the output port 100*b* includes a first output port 104 connected to an output port that outputs an output signal from the inverter 103 and a second output port 105 connected to an output port that outputs an output signal from the inverter 102. That is, the output port 100*b* is configured to be able to output two independent signals: an output signal from the inverter 102 and an output signal from the inverter 103.

Figure 11:
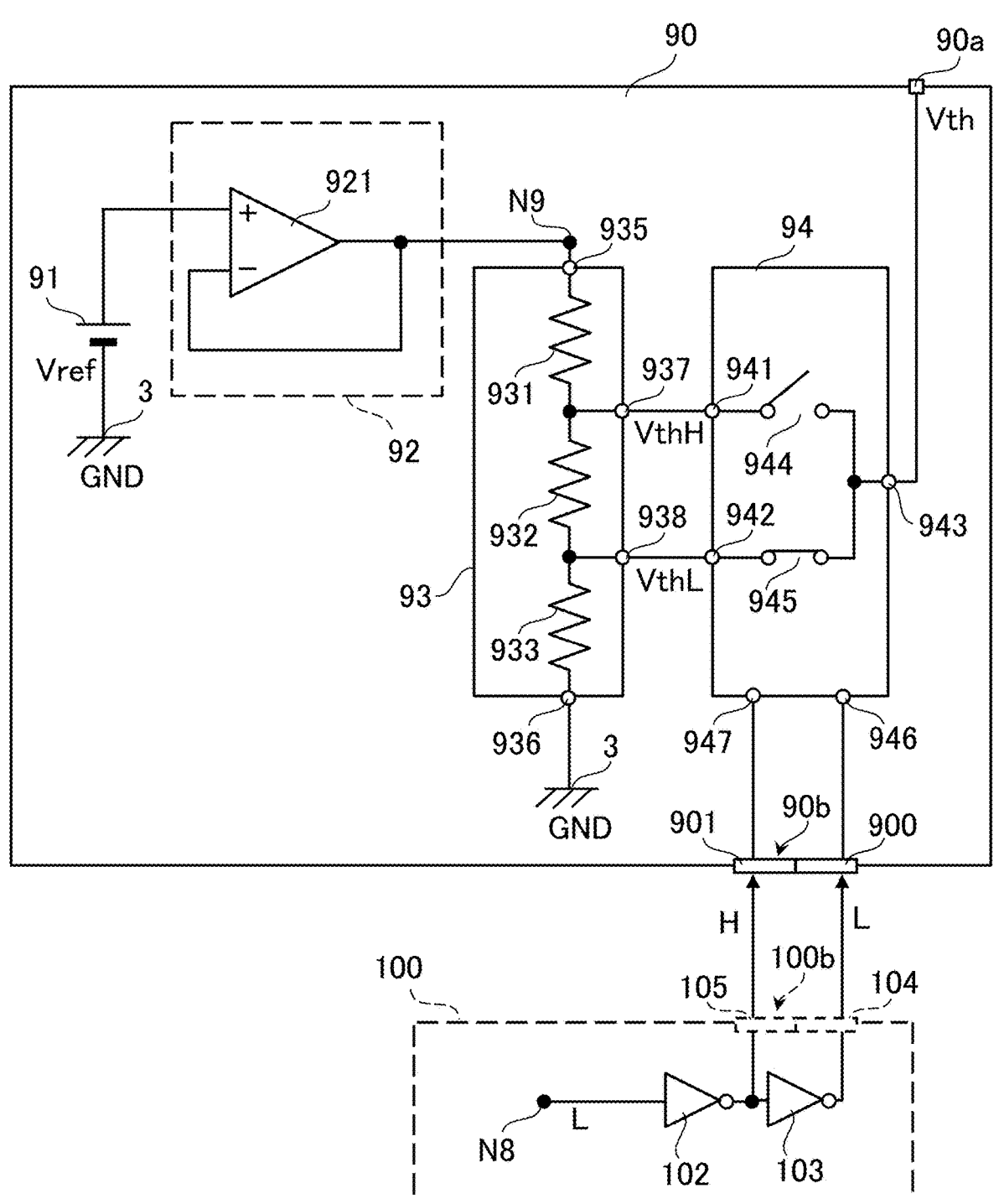
FIG. 11 is a schematic diagram illustrating a first configuration example of a voltage source of a voltage-current conversion circuit included in the current limiter circuit according to the second embodiment.

FIG. 11 is a schematic diagram illustrating in more detail an example of the configuration of the voltage source 90 in the V/I conversion circuit 34.

The voltage source 90 includes a reference voltage source 91, a buffer circuit 92, a voltage dividing circuit 93, and a selector 94. The reference voltage source 91 supplies a reference voltage Vref. The voltage dividing circuit 93 divides the voltage output from the buffer circuit 92 to obtain a threshold voltage VthH and a threshold voltage VthL. The selector 94 outputs one of the threshold voltage VthH and threshold voltage VthL that are supplied as the threshold voltage Vth according to the signal level of the signal supplied from the current comparison circuit 100.

The buffer circuit 92 is composed of, for example, a voltage follower. The voltage dividing circuit 93 is, for example, configured by connecting three resistance elements 931, 932, and 933 in series, and includes a first input port 935 connected to one port of the three resistance elements connected in series, a second input port 936 connected to the other port, a first output port 937 connected to a connection point of the resistance elements 931 and 932, and a second output port 938 connected to a connection point of the resistance elements 932 and 933. The first input port 935 is connected to a node N9 which is the same node as the output port of the buffer circuit 92. The second input port 936 is connected to the GND terminal 3.

The selector 94 includes a first input port 941, a second input port 942, an output port 943, a switch 944 which connects the first input port 941 and the output port 943 in an openable/closable manner, a switch 945 which connects the second input port 942 and the output port 943 in an openable/closable manner, a control port 946 of the switch 944, and a control port 947 of the switch 945. Here, the switch 944 and the switch 945 are switches that close if a high level signal is supplied to the control port 946 and the control port 947, and opens if a low level signal is supplied. The selector 94 is configured to be able to output one of the supplied threshold voltage VthH and the threshold voltage VthL as the threshold voltage Vth by being controlled to open and close so that one of the switch 944 and the switch 945 is open and the other is closed.

The voltage dividing circuit 93 has the first output port 937 connected to the first input port 941 and the second output port 938 connected to the second input port 942 with respect to the selector 94. In the selector 94, the output port 943 is connected to the output port 90*a* of the voltage source 90. The control port 946 of the selector 94 is connected to a first control port 900 included in the control port 90*b* of the voltage source 90. The first control port 900 is connected to the first output port 104 included in the output port 100*b* of the current comparison circuit 100. The control port 947 of the selector 94 is connected to a second control port 901 included in the control port 90*b*. The second control port 901 is connected to the second output port 105 included in the output port 100*b*.

Next, the operation and effects of the current limiter device 1B including the current limiter circuit 10B will be described.

The current limiter circuit 10B controls the current supplied to the load 4 by controlling the on-resistance (resistance value) of the NMOSFET 21 and the NMOSFET 22 connected between the input terminal Tin and the output terminal Tout. The gate controller 50 generates a control signal that combines the node N3 on the input terminal Tin side, a voltage detection signal based on the voltage of the node N1 on the output terminal Tout side, and a negative feedback signal from the negative feedback circuit 30B. A gate controller 50B controls the on-resistances (resistance values) of the NMOSFETs 21 and 22 by supplying the generated control signals to the gates of the NMOSFETs 21 and 22 serving as the control port of the switch 2.

In the negative feedback circuit 30B, the current I1 which is the negative feedback signal as described above can be expressed as the product (=Gm1×Vod) of the mutual conductance Gm1 of the OTA 80 (FIG. 10) and the differential voltage Vod. Moreover, the current I2 supplied to the current comparison circuit 100 (FIGS. 9 and 10) can be expressed as the product (=Gm2×Vod) of the mutual conductance Gm2 of the OTA 80 and the differential voltage Vod.

Here, considering the relationship (I1=−I3) between the current I1 and a current I3 which are drain currents of the pair of NMOS transistors 81*a* and 81*b* (FIG. 10) forming a differential pair and the relationship (I2=k×I3) between the current mirror circuit (mirror ratio k) formed by the PMOS transistors 83 and 84 (FIG. 10), the relationship between the current I1 and the current I2 can be expressed by the following formula (4).

$$I2 = k \times I3 = k \times (-I1) = -k \times I1 \qquad (4)$$

If the current I2 is supplied to the current comparison circuit 100 (FIG. 10), the current comparison circuit 100 compares the magnitude of the current I2 and the constant current Ib2. If the current I2 is larger than the constant current Ib2, the higher threshold voltage VthH is selected, and if the current I2 is smaller than the constant current Ib2, the lower threshold voltage VthL is selected. Note that if the output voltage Vout≈0 [V] immediately after startup, the current comparison circuit 100 is set so as to output the switching signal of the threshold voltage Vth that selects the higher threshold voltage VthH.

The current limiter circuit 10B that operates in this manner determines whether the current I2 is larger than the constant current Ib2 or not, in other words, depending on whether the differential voltage Vod (=Vssc−Vth) between the voltage Vssc and the threshold voltage Vth is greater than a predetermined voltage, the threshold voltage Vth is switched to the threshold voltage VthH or the threshold voltage VthL to effect negative feedback.

In the current limiter circuit 10B, the voltage Vssc is 0 [V] in the steady state, so the differential voltage Vod between the voltage Vssc and the threshold voltage Vth (>0) becomes a negative voltage (Vod<0), and the current I1 does not flow through the path P1 (I1=0). Thus, in the current limiter circuit 10B, the voltage detection signal transmitted from the path P2 is dominant in the steady state. That is, in the steady state, the voltage detection signal transmitted from the path P2 becomes a de facto control signal, and the on-resistances (resistance values) of the NMOSFET 21 and the NMOSFET 22 are controlled.

Next, the operation of the current limiter circuit 10B during an unsteady state where the output voltage Vout is increasing will be described.

Figure 12:
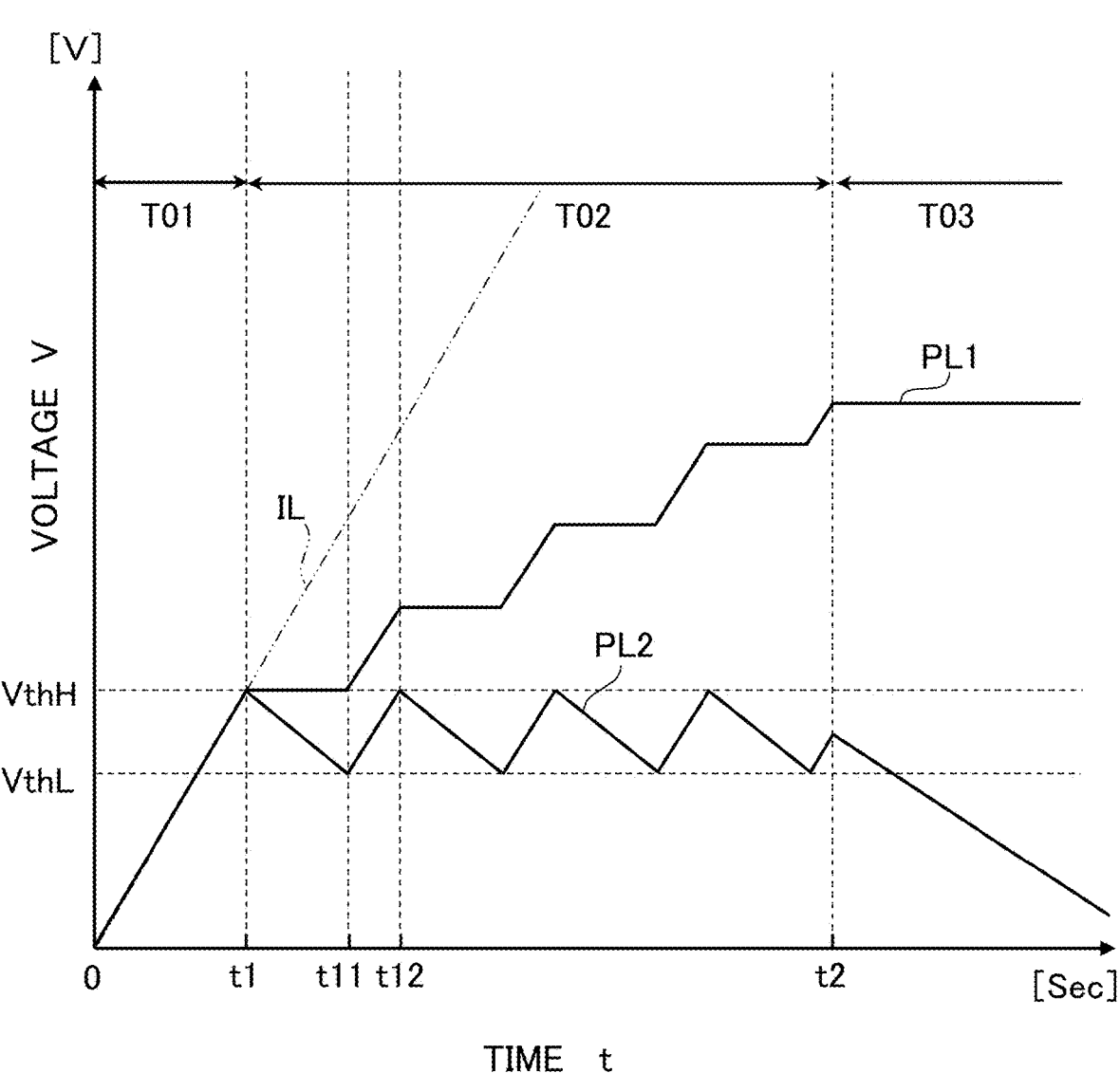
FIG. 12 is a graph illustrating the time transition of the output voltage in the current limiter circuit and the voltage of the input port of the negative feedback circuit in the second embodiment, with the horizontal axis representing time and the vertical axis representing voltage.

FIG. 12 is a graph illustrating the time transition of the output voltage Vout (line PL1) in the current limiter circuit 10B and the input port 10c of the negative feedback circuit 30B, that is, the voltage Vssc (line PL2) of the node N4, with the horizontal axis representing time t and the vertical axis representing voltage V.

For description, it is assumed that the output voltage Vout starts to rise at time t=0 [second], the voltage Vssc reaches the threshold voltage VthH at time t=t1, and the rise in the output voltage Vout ends at time t=t2. Moreover, the voltage Vssc of the node N4 in the steady state is Vssc=GND=0 [V]. Furthermore, line PL1 and line PL2 illustrated in FIG. 12 represent voltage Vssc and output voltage Vout, respectively.

If the output voltage Vout starts to rise (time t=0 seconds), a positive charge is accumulated at the upper port of the capacitor 6, and a negative charge is accumulated at the lower port. The movement of charge in the capacitor 6 can be regarded as a current Ic flowing through the capacitor 6. The current Ic can be expressed by the following formula (5) using the capacitance value Cssc of the capacitor 6 and the output voltage Vout.

$$Ic = Cssc \times d\text{Vout}/dt \qquad (5)$$

If the current Ic flowing through the capacitor 6 is greater than the current value Issc of the constant current supplied by the constant current source 310, the voltage Vssc (line PL2) rises. Furthermore, the output voltage Vout (line PL1) rises without negative feedback during a period T01 until time t=t1 when the voltage Vssc (line PL2) reaches the threshold voltage VthH.

At time t=t1, if the voltage Vssc exceeds the threshold voltage VthH, the V/I conversion circuit 34 generates the current I1 proportional to the differential voltage Vod (=Vssc−VthH). As described above, since the voltage at the output port 50d decreases if the current I1 flows, the gate controller 50 decreases the gate voltage of the NMOSFET 21, and decreases the output current Iout of the NMOSFET 21. That is, in the current limiter circuit 10B, negative feedback is applied if the voltage Vssc exceeds the threshold voltage VthH.

In the current comparison circuit 100 (FIG. 10), at the stage where the voltage Vssc is rising and is close to the threshold voltage VthH, the current I1 flowing through the drain of the NMOS transistor 81a increases, and the current I3 flowing through the drain of the NMOS transistor 81b and the current I2 flowing through the drain of the PMOS transistor 84 decrease. As the current I2 decreases, the current I2 eventually becomes lower than the constant current Ib2. If the current I2 becomes lower than the constant current Ib2, the current comparison circuit 100 inverts the signal level of the switching signal of the threshold voltage Vth and switches the threshold voltage Vth to the threshold voltage VthL. If the threshold voltage Vth is switched to the threshold voltage VthL, the differential voltage Vod and the current I1 become larger, and the rising slope of the output current Iout and the output voltage Vout approaches 0 after time t=t1 (FIG. 12).

Further, from time t=t1 (FIG. 12), the charge in the capacitor 6 is discharged by the constant current source 310, and the voltage Vssc starts to decrease. In the current comparison circuit 100 (FIG. 10), at the stage where the voltage Vssc is decreasing and is close to the threshold voltage VthL, the current I1 flowing through the drain of the NMOS transistor 81a decreases, and the current I3 flowing through the drain of the NMOS transistor 81b and the current I2 flowing through the drain of the PMOS transistor 84 increase. If the current I2 increases and exceeds the constant current Ib2 at time t=t11, the voltage Vssc decreases to the threshold voltage Vth=VthL.

If the voltage Vssc decreases to the threshold voltage Vth=VthL, the current comparison circuit 100 inverts the signal level of the switching signal of the threshold voltage Vth and switches the threshold voltage Vth to the threshold voltage VthH. By switching the threshold voltage Vth to the threshold voltage VthH, the differential voltage Vod and the current I1 become smaller. After time t=t11 (FIG. 12), negative feedback is not applied as in the period T01, so the output current Iout increases and the output voltage Vout rises. Thereafter, at time t=t12, if the voltage Vssc exceeds the threshold voltage VthH, the V/I conversion circuit 34 generates the current I1 proportional to differential voltage Vod. After time t=t12, the operation from time t=t1 to t12 (t1≤t<t12) is repeated.

The negative feedback circuit 30B (more specifically, the V/I conversion circuit 34) suppresses the rise in the output voltage Vout in a gentle stepwise manner by repeating the hysteresis operation of switching to the different threshold voltage Vth if the voltage Vssc rises and falls. The hysteresis operation of the negative feedback circuit 30B continues during the period T02 until time t=t2 when the rise in the output voltage Vout ends.

Furthermore, at time t=t2, if the rise in the output voltage Vout (line PL1) ends, in the period T03 after time t=t2, the voltage Vssc (line PL2) decreases toward 0 [V], which is the voltage in the steady state. On the other hand, the output voltage Vout becomes substantially equal to the input voltage Vin, which is the voltage of the input terminal Tin, and thus becomes a constant value.

In this way, according to the current limiter circuit 10, the voltage rise per unit time of the output voltage Vout, which is the slope of the line PL2 during the period T02 is suppressed to be smaller than an imaginary line IL obtained by extending the slope of the line PL2 in the period T01 to the period T02.

As described above, according to the current limiter circuit 10B and the current limiter device 1B including the current limiter circuit 10B, since a capacitor for slowing the change in gate voltage of NMOSFET 21 and NMOSFET 22 is not connected, the speed at which the switch 2 is turned off is not hindered. On the other hand, if the output voltage Vout suddenly increases, by repeating the on state where the negative feedback circuit 30B applies negative feedback and the off state where no negative feedback is applied, the increase in the output voltage Vout can be suppressed in a stepwise manner, that is, the increase in the output voltage Vout can be limited to a gradual increase with respect to the imaginary line IL. Thus, according to the current limiter circuit 10B and the current limiter device 1B including the current limiter circuit 10B, in a situation where the output voltage Vout suddenly increases, inrush current can be limited.

The stepwise characteristic in the case of the output voltage Vout increasing is mainly determined by the hysteresis of the threshold voltage Vth of the voltage source 90 and the constant of the DC cut filter 70, such as the capacitance value Cssc of the capacitor 6 and the current value Issc supplied by the constant current source 310, so the degree of freedom in design is high. Furthermore, the above-described limiting control of the output voltage Vout is not involved in the off control of the FET in which the output voltage Vout decreases, and thus does not become a factor that inhibits quick off control.

In this way, according to the current limiter circuit 10B and the current limiter device 1B including the current limiter circuit 10B, similar to the current limiter circuit 10A and the current limiter device 1A, if the output voltage Vout increases, the increase can be limited without reducing the switch-off speed. In other words, there is no trade-off between current suppression and switch-off speed, and current suppression and switch-off speed can both be achieved.

According to the current limiter circuit 10B and the current limiter device 1B including the current limiter circuit 10B, similar to the current limiter circuit 10A and the current limiter device 1A, there is no need to separately provide a gate controller for operating the current limiter transistor and a gate controller for operating the backflow prevention transistor, and the gate controller 50 can be integrated into one gate controller.

The current limiter circuit 10B and the current limiter device 1B including the current limiter circuit 10B are mainly determined by the hysteresis of the threshold voltage Vth of the voltage source 90 and the constant of the DC cut filter 70, so a circuit and a device with the high degree of freedom in design can be provided.

Note that in the embodiment, the voltage source 90 in the V/I conversion circuit 34 is not limited to the above-described configuration. The V/I conversion circuit 34 may include a voltage source 90A, a voltage source 90B, or a voltage source 90C instead of the voltage source 90. Next, the voltage source 90A, the voltage source 90B, and the voltage source 90C will be described.

Figure 13:
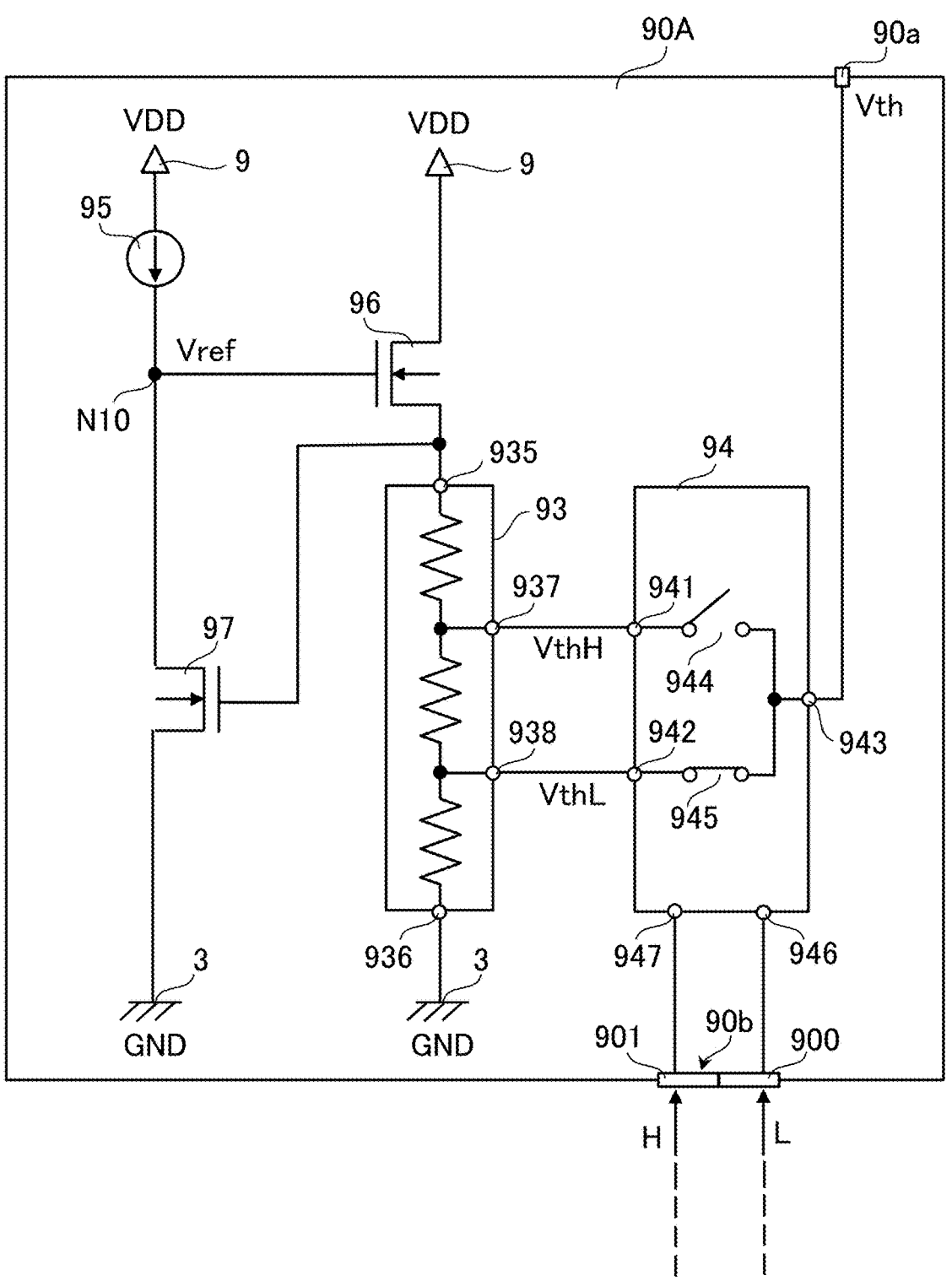
FIG. 13 is a schematic diagram illustrating a modified example (second configuration example) of the voltage source of the voltage-current conversion circuit included in the current limiter circuit according to the embodiment.
Figure 14:
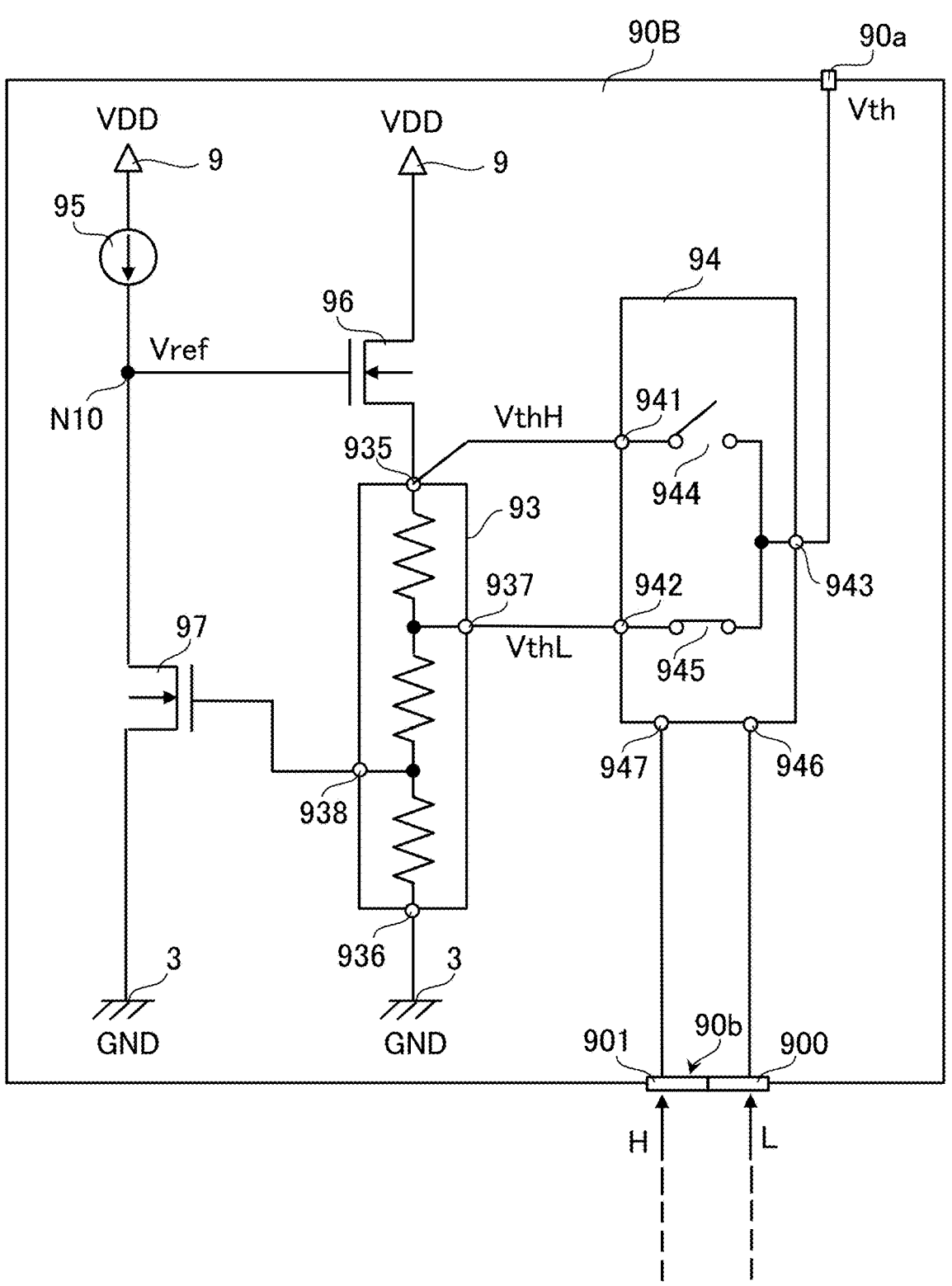
FIG. 14 is a schematic diagram illustrating a modified example (third configuration example) of the voltage source of the voltage-current conversion circuit included in the current limiter circuit according to the embodiment.
Figure 15:
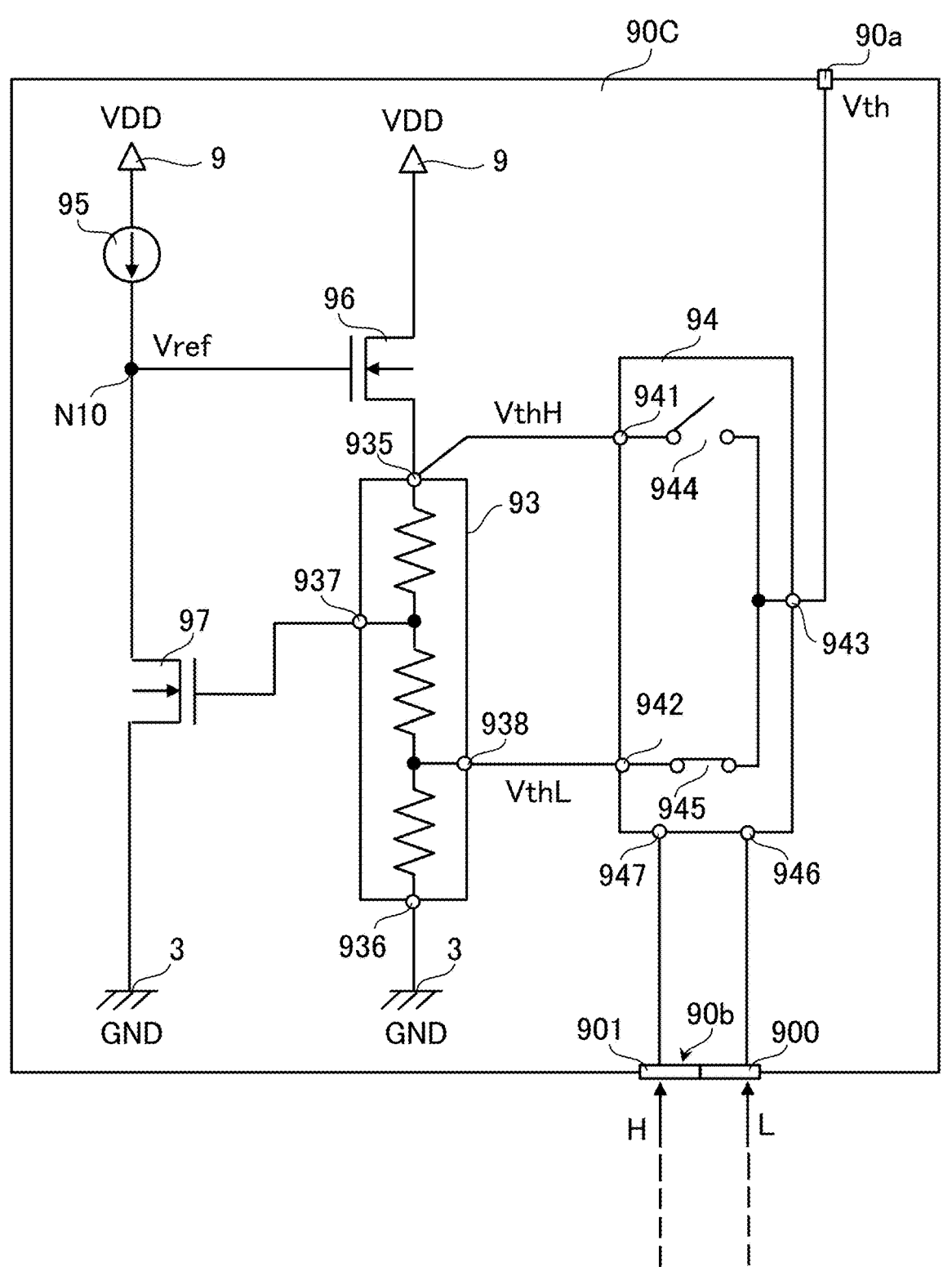
FIG. 15 is a schematic diagram illustrating a modified example (fourth configuration example) of the voltage source of the voltage-current conversion circuit included in the current limiter circuit according to the embodiment.

FIGS. 13, 14, and 15 are schematic diagrams illustrating configuration examples of the voltage source 90A, the voltage source 90B, and the voltage source 90C in more detail, respectively.

The voltage source 90A (FIG. 13) is different from the voltage source 90 (FIG. 11) in that the voltage source 90A includes a constant current source 95 and an NMOS transistor 97 forming a reference voltage circuit and an NMOS transistor 96 that constitutes a source follower with a voltage dividing circuit 93 as a load instead of the reference voltage source 91 and the buffer circuit 92, but otherwise there are no substantial differences. Thus, the constant current source 95, the NMOS transistor 96, and the NMOS transistor 97 will be mainly described, and the voltage dividing circuit 93 and the selector 94, which are components that overlap with those of the voltage source 90, are denoted by the same reference numerals and will not be described again.

One port of the constant current source 95 is connected to the VDD terminal 9. The NMOS transistor 97 includes a source connected to the GND terminal 3, a gate connected to the first input port 935 of the voltage dividing circuit 93, and a drain connected to the other port of the constant current source 95. The NMOS transistor 96 includes a drain connected to the VDD terminal 9, a gate connected to a connection point between the other port of the constant current source 95 and the drain of the NMOS transistor 97, that is, a node N10, and a source connected to first input port 935 of the voltage dividing circuit 93.

In the voltage source 90A configured in this manner, the reference voltage Vref generated at the node N10 is supplied to the first input port 935 of the voltage dividing circuit 93. Among the divided voltages obtained by the voltage dividing circuit 93, the threshold voltage VthH is supplied from the first output port 937 to the first input port 941 of the selector 94, and the threshold voltage VthL is supplied from the second output port 938 to the second input port 942 of the selector 94. Note that the voltage of the first input port 935 of the voltage dividing circuit 93, that is, the voltage of the source of the NMOS transistor 96 is supplied to the gate of the NMOS transistor 97. The operation of the selector 94 is similar to that of the voltage source 90.

The voltage source 90B (FIG. 14) and the voltage source 90C (FIG. 15) are different from the voltage source 90A (FIG. 13) in the connection destinations of the first input port 935, the first output port 937, and the second output port 938 of the voltage dividing circuit 93, but have the same elements as the voltage source 90A. In the voltage source 90B, the first input port 935, the first output port 937, and the second output port 938 are connected to the first input port 941, the second input port 942, and the gate of the NMOS transistor 97, respectively. In the voltage source 90C, the first input port 935, the first output port 937, and the second output port 938 are connected to the first input port 941, the gate of the NMOS transistor 97, and the second input port 942, respectively.

In addition, the present invention is not limited to the above-described embodiment, in the implementation stage, implement may be performed in various forms other than the above-described embodiment, and various omissions, additions, replacements, or modifications may be made without departing from the spirit of the present invention. For example, the above-mentioned switch 2 has been described using as an example a configuration including multiple transistors including the NMOSFET 21 which is a current limiter transistor and the NMOSFET 22 which is a backflow prevention transistor, but the present invention is not limited to the example.

The current limiter transistor and the backflow prevention transistor constituting the switch 2 may be a P-type MOSFET (hereinafter, referred to as a "PMOSFET"). Furthermore, the switch 2 merely needs to include a current limiter transistor such as the NMOSFET 21, and the backflow prevention transistor may be omitted. Further, the current limiter transistor and the backflow prevention transistor constituting the switch 2 may be of any type as long as they are at least one transistor. In other words, in addition to the MOSFET, the current limiter transistor may be appropriately selected from other field effect transistors such as a junction FET (JFET), a metal insulating film semiconductor FET (MISFET), or a bipolar transistor.

In the current limiter circuits 10A and 10B described above, the case where the input port 10e is connected to the GND terminal 3 has been described, but the power supply port to which the input port 10e is connected is not limited to the GND terminal 3, and may be another power supply port (not shown) that supplies a power supply voltage different from the ground voltage GND.

Furthermore, in the current limiter devices 1A and 1B and the current limiter circuits 10A and 10B, the gate controller 50 and the clamp circuit 31 are not limited to the above-described configurations, and may employ a modified example as described later for at least one of the gate controller 50 and the clamp circuit 31. That is, the current limiter circuits 10A and 10B may include a gate controller 50A or a gate controller 50B instead of the gate controller 50. The current limiter circuits 10A and 10B may include a clamp circuit 31A or a clamp circuit 31B instead of the clamp circuit 31.

Here, the gate controller 50A and the gate controller 50B as well as the clamp circuit 31A and the clamp circuit 31B, which are modified examples of the gate controller 50 and the clamp circuit 31, will be described.

Figure 16:
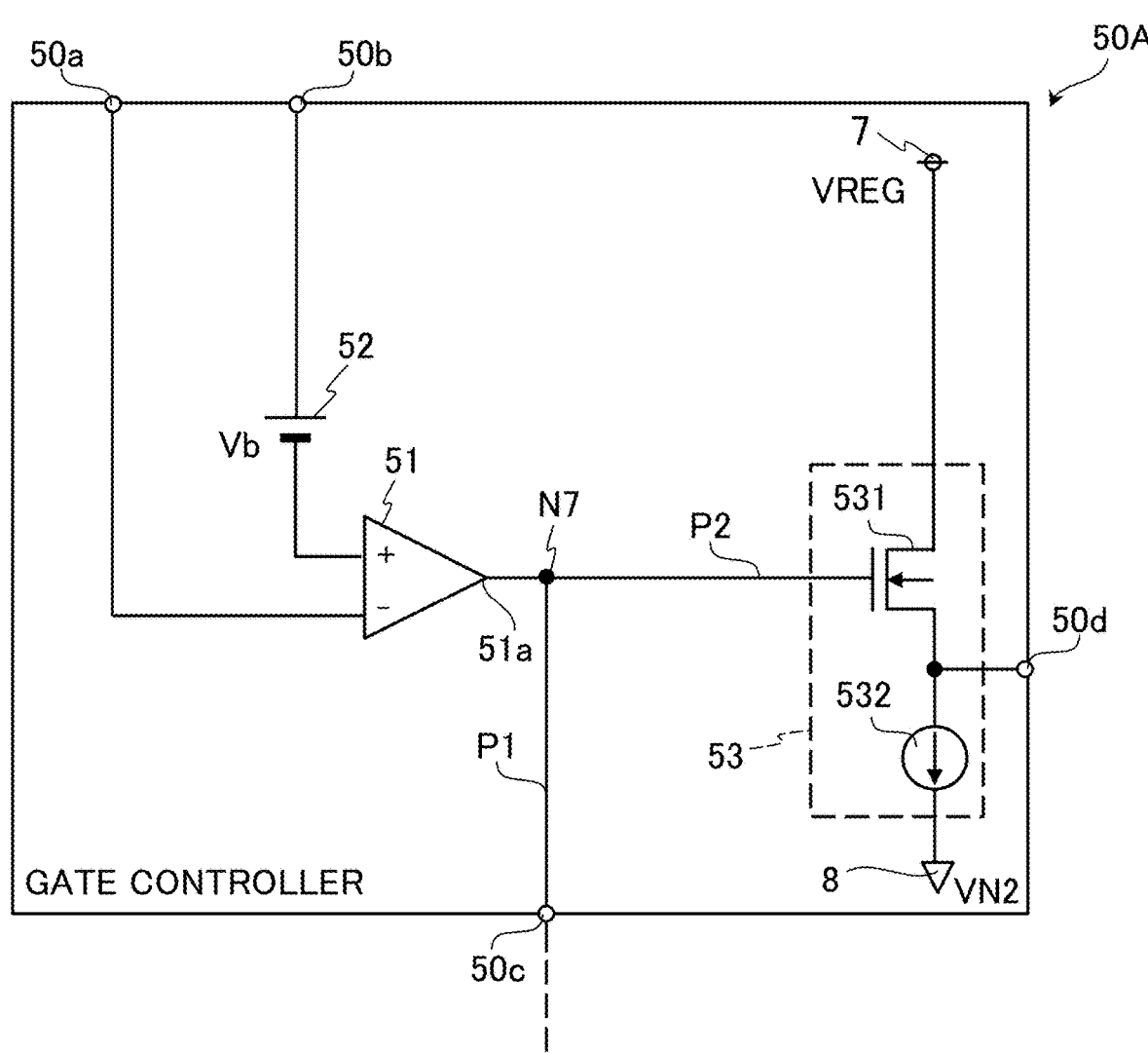
FIG. 16 is a schematic diagram illustrating a modified example (second configuration example) of the gate controller included in the current limiter circuit according to the embodiment.
Figure 17:
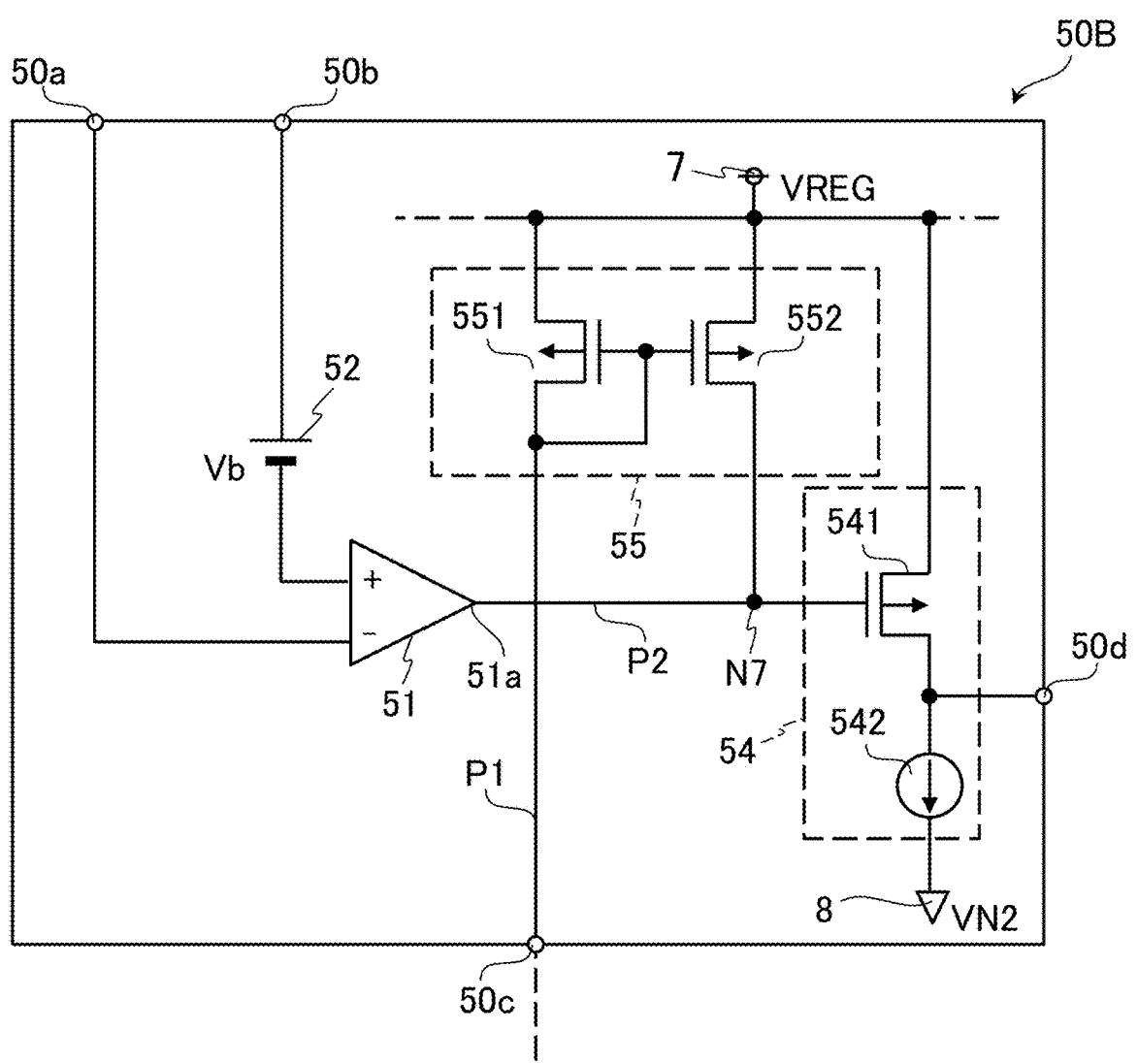
FIG. 17 is a schematic diagram illustrating another modified example (third configuration example) of the gate controller included in the current limiter circuit according to the embodiment.

FIGS. 16 and 17 are schematic diagrams illustrating the gate controller 50A and the gate controller 50B, respectively, which are modified examples of the gate controller 50.

The gate controller 50A differs from the gate controller 50 in that the gate controller 50A further includes a source follower circuit 53 as an output circuit connected between the node N7 and the output port 50d, but is substantially the same in other respects. The source follower circuit 53 includes an NMOSFET 531 and a constant current source 532.

The source follower circuit 53 operates as a buffer for the gate controller 50 to lower the output impedance. Here, a VREG port 7 is one of the power supply ports that supplies a voltage-adjusted power supply voltage VREG, and is a power supply port different from the GND terminal 3 and the VDD terminal 9. Further, a VN2 port 8 is one of the power supply ports that supplies a voltage VN2 of the node N2, and is a power supply port different from the GND terminal 3, the VDD terminal 9, and the VREG port 7.

The gate controller 50B differs from the gate controller 50 in that the gate controller 50B further includes a current mirror circuit 55 configured by connecting a PMOSFET 551 and a PMOSFET 552 and a source grounded amplifier circuit 54 as an output circuit connected between the node N7 and output port 50d, but is substantially the same in other respects.

In the current mirror circuit 55, a gate and a drain of the PMOSFET 551 and a gate of the PMOSFET 552 are connected. The source grounded amplifier circuit 54 includes a PMOSFET 541 and a constant current source 542, and increases the gain with respect to the gate controller 50.

Note that the voltage detection circuit 51 described above may use a differential input comparator in addition to a general differential input amplifier. If the gate controllers 50, 50A, and 50B include the voltage detection circuit 51 composed of a comparator, the switch 2 and the peripheral circuitry may be configured so as to be turned on by a control signal of one of the two signal levels (for example, high level) and be turned off by a control signal of the other signal level (for example, low level).

The above-mentioned voltage source 52 is connected between the input port 50b and the non-inverting input port (+), but the voltage source 52 may be connected between the input port 50a and the inverting input port (−). Further, the voltage drop Vb of the voltage source 52 is not limited to a positive case, but also includes a case where the voltage drop Vb=0 [V] or a negative case. That is, the voltage source 52 may be omitted or the polarity may be reversed.

In the case of turning on the NMOSFET 21 and the NMOSFET 22, a booster circuit may be used to enable switching operation at a voltage higher than the input terminal Tin.

Figure 18A:
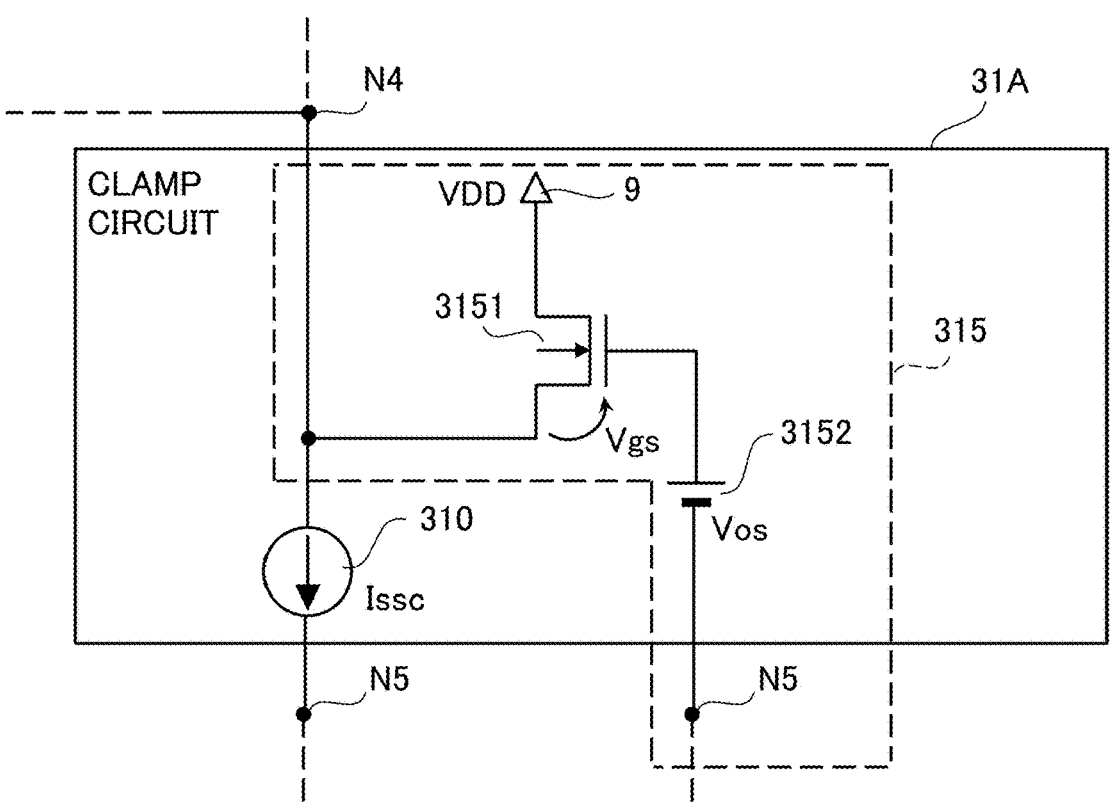
FIG. 18A is a schematic diagram illustrating a modified example (second configuration example) of the clamp circuit included in the current limiter circuit according to the embodiment.
Figure 18B:
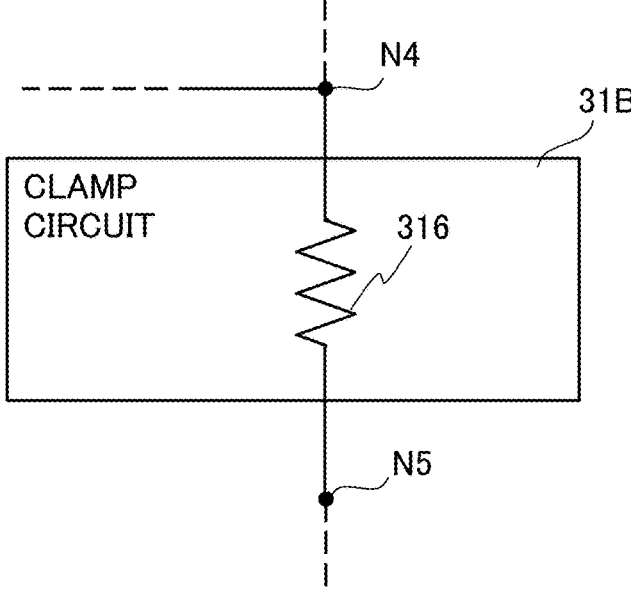
FIG. 18B is a schematic diagram illustrating another modified example (third configuration example).

FIGS. 18A and 18B are schematic diagrams illustrating the clamp circuit 31A and the clamp circuit 31B that are modified examples of the clamp circuit 31.

The clamp circuit 31A differs from the clamp circuit 31 in that the clamp circuit 31A further includes a bias circuit 315 which supplies a predetermined voltage to the first port of the constant current source 310, that is, the same node as the node N4, but is substantially the same in other respects. The bias circuit 315 is, for example, configured by a source follower circuit including an NMOSFET 3151 and a reference voltage source 3152 which supplies a voltage Vos to the gate of the NMOSFET 3151. The bias circuit 315 supplies a predetermined voltage as a bias voltage to the node N4.

If the bias circuit 315 is set so that the voltage Vssc of the node N4 during the steady state does not exceed the threshold voltage Vth of the V/I conversion circuit 33 and the V/I conversion circuit 33A described later, in the steady state, the current I1 does not flow. On the other hand, if a predetermined voltage is supplied as a bias voltage to the same node as the node N4, the current I1 can be made to flow even if the output voltage Vout changes smaller than in the case of no bias voltage being supplied.

Here, in response to the gate-source voltage of the NMOSFET 3151 being the voltage Vgs, the voltage Vssc of the node N4 is Vssc=Vos−Vgs. Thus, in order to set the voltage Vssc of the node N4 in a steady state so as not to exceed the threshold voltage Vth, the NMOSFET 3151 and the reference voltage source 3152 may be selected so as to satisfy Vos−Vgs<Vth.

The clamp circuit 31B illustrated in FIG. 18B differs in that the clamp circuit 31B includes a resistor 316 instead of the constant current source 310 of the clamp circuit 31, but is substantially the same in other respects. Here, the resistor 316 is a component including a predetermined resistance value and includes any one selected from a resistance element, a diode element, and an on-resistance of a diode-connected FET. Note that the clamp circuit 31B is also applicable to the clamp circuit 31A. That is, the clamp circuit 31A may include a resistor 316 instead of the constant current source 310.

The above-described embodiments and their modifications are included in the scope and spirit of the present invention, and are also included in the present invention included in the present invention described in the claims and their equivalents.

What is claimed is:

1. A current limiter circuit, which limits a current in a path connecting an input terminal and an output terminal through a switch including a control port, the switch controlling the current to a predetermined value or less, comprising:
    a negative feedback circuit, comprising an input port coupled to a first node via an external capacitor configured to be coupled to the first node provided between the switch and the output terminal and an output port connected to a first input port of a controller; and
    the controller, comprising the first input port which is connected to a connection point between a first path through which a first signal is transmitted and a second path through which a second signal based on a voltage of the first node is transmitted, and receives the first signal, and an output port which supplies a control signal combining the first signal and the second signal to a control port of the switch.

2. The current limiter circuit according to claim 1, wherein
    the negative feedback circuit comprises a voltage-current conversion circuit connected between a first input port of the controller and a second node to which a first power supply voltage is supplied, and converting a voltage of an input port of the negative feedback circuit into a current based on a differential voltage between the voltage of the input port of the negative feedback circuit and the threshold voltage if the voltage of the input port of the negative feedback circuit is higher than a threshold voltage, and
    a clamp circuit connected between the input port of the negative feedback circuit and the second node, and clamping a voltage of the input port of the negative feedback circuit to the first power supply voltage or to a predetermined voltage higher than the first power supply voltage and lower than the threshold voltage.

3. The current limiter circuit according to claim 2, wherein the clamp circuit comprises a first constant current source which comprises a first port connected to the input port of the negative feedback circuit and a second port connected to the second node.

4. The current limiter circuit according to claim 3, wherein the first constant current source comprises a depletion type field effect transistor (FET) with a source and a gate connected.

5. The current limiter circuit according to claim 3, wherein the first constant current source comprises a first FET comprising a drain connected to the input port of the negative feedback circuit, a source connected to the second node, and a gate,
    a second FET comprising a drain connected to the gate of the first FET, a source connected to the second node, and a gate connected to the gate of the first FET and the drain of the second FET, and
    a second constant current source supplying a constant current to the drain of the second FET.

6. The current limiter circuit according to claim 3, wherein the clamp circuit comprises a bias circuit supplying the predetermined voltage to a node connecting the input port of the negative feedback circuit, the clamp circuit, and the voltage-current conversion circuit.

7. The current limiter circuit according to claim 2, wherein the clamp circuit comprises a resistor comprising a first end connected to the input port of the negative feedback circuit and a second end connected to the second node.

8. The current limiter circuit according to claim 2, wherein
    the clamp circuit comprises
    a resistor comprising a first end connected to the input port of the negative feedback circuit and a second end connected to the second node, and
    a bias circuit supplying the predetermined voltage to a node connecting the input port of the negative feedback circuit, the clamp circuit, and the voltage-current conversion circuit.

9. The current limiter circuit according to claim 2, wherein the voltage-current converter circuit comprises an FET connected between the connection point and the second node, the FET comprising a gate connected to a first port of the clamp circuit.

10. The current limiter circuit according to claim 2, wherein the voltage-current conversion circuit comprises an amplifier circuit comprising a first input port connected to a first port of the clamp circuit, a second input port receiving the threshold voltage, and an output port connected to the connection point, and supplying a current based on a differential voltage between a voltage of the first input port and the threshold voltage supplied to the second input port to the output port of the amplifier circuit.

11. The current limiter circuit according to claim 2, wherein
    the voltage-current conversion circuit comprises
    an amplifier circuit comprising a first input port connected to a first port of the clamp circuit, a second input port receiving the threshold voltage, a first output port connected to the connection point, and a second output port,
    a voltage source comprising a control port receiving a switching signal for switching the threshold voltage as a first threshold voltage or a second threshold voltage, and an output port switching and outputting the threshold voltage by switching between the first threshold voltage and the second threshold voltage, and an output port switching the threshold voltage to be outputted as the first threshold voltage or the second threshold voltage based on the switching signal and outputting the same, and
    a switching signal generation circuit comprising an input port connected to the second output port of the amplifier circuit and an output port connected to the control port of the voltage source and outputting the switching signal, and generating the switching signal comprising two different signal levels corresponding to the magnitude of a current supplied to the input port.

12. The current limiter circuit according to claim 1, wherein
    the controller comprises
    a second input port connected to the first node,
    a third input port connected to a third node provided between the switch and the input terminal,
    a voltage detection circuit comprising a first input port connected to the second input port of the controller, a second input port connected to the third input port of the controller, and an output port outputting a signal which comprises a plurality of signal levels and is based on a voltage difference between voltages respectively received at the first input port and the second input of the controller as the second signal, and an output port connected to the output port of the voltage detection circuit via the connection point.

13. The current limiter circuit according to claim 12, further comprising a source-grounded amplifier circuit connected between the connection point and the output port of the controller, wherein the source-grounded amplifier circuit comprising an FET of which a gate receives a voltage of the connection point.

14. The current limiter circuit according to claim 12, further comprising a source follower circuit connected between the connection point and an output port of the controller, wherein the source follower circuit comprising an FET of which a gate receives a voltage of the connection point.

15. A current limiter device, comprising:

an input terminal;

an output terminal;

a switch, comprising a control port and limiting a current to a predetermined value or less;

a capacitor, comprising a first end connected to a first node provided between the switch and the output terminal and a second end;

a controller, comprising a first input port which comprises a connection point between a first path through which a first signal based on a voltage of the first node is transmitted and a second path through which a second signal is transmitted, and receives the first signal and an output port which supplies a control signal combining the first signal and the second signal to a control port of the switch; and a negative feedback circuit, comprising an input port coupled to the first node via the capacitor in the case of being connected to the second port of the capacitor and an output port connected to the first input port of the controller.

16. A current limiter circuit, which limits a current in a path connecting an input terminal and an output terminal through a switch including a control port, the switch controlling the current to a predetermined value or less, comprising:

a controller, comprising a first input port which is connected to a connection point between a first path through which a first signal is transmitted and a second path through which a second signal is transmitted, and receives the first signal, and an output port which supplies a control signal combining the first signal and the second signal to a control port of the switch; and a negative feedback circuit, comprising an input port coupled to a first node via an external capacitor configured to be coupled to the first node provided between the switch and the output terminal and an output port connected to the first input port of the controller, wherein the negative feedback circuit comprises:

a voltage-current conversion circuit connected between a first input port of the controller and a second node to which a first power supply voltage is supplied, and converting a voltage of an input port of the negative feedback circuit into a current based on a differential voltage between the voltage of the input port of the negative feedback circuit and the threshold voltage if the voltage of the input port of the negative feedback circuit is higher than a threshold voltage; and a clamp circuit connected between the input port of the negative feedback circuit and the second node, and clamping a voltage of the input port of the negative feedback circuit to the first power supply voltage or to a predetermined voltage higher than the first power supply voltage and lower than the threshold voltage.

17. The current limiter circuit according to claim 16, wherein the controller comprises:

a second input port connected to the first node, a third input port connected to a third node provided between the switch and the input terminal, a voltage detection circuit comprising a first input port connected to the second input port of the controller, a second input port connected to the third input port of the controller, and an output port outputting a signal which comprises a plurality of signal levels and is based on a voltage difference between voltages respectively received at the first input port and the second input of the controller as the second signal, and an output port connected to the output port of the voltage detection circuit via the connection point.

* * * * *